United States Patent
Kanno et al.

(10) Patent No.: US 11,233,052 B2
(45) Date of Patent: Jan. 25, 2022

(54) METHOD OF MANUFACTURING SEMICONDUCTOR INTEGRATED CIRCUIT

(71) Applicant: FUJI ELECTRIC CO., LTD., Kawasaki (JP)

(72) Inventors: Hiroshi Kanno, Matsumoto (JP); Masaharu Yamaji, Matsumoto (JP); Hitoshi Sumida, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/034,856

(22) Filed: Sep. 28, 2020

(65) Prior Publication Data

US 2021/0013203 A1 Jan. 14, 2021

Related U.S. Application Data

(63) Continuation of application No. 16/043,889, filed on Jul. 24, 2018, now Pat. No. 10,825,812, which is a
(Continued)

(30) Foreign Application Priority Data

Aug. 12, 2016 (JP) .............................. JP2016-158763

(51) Int. Cl.
*H01L 27/092* (2006.01)
*H01L 23/00* (2006.01)
(Continued)

(52) U.S. Cl.
CPC .......... *H01L 27/0921* (2013.01); *H01L 24/48* (2013.01); *H01L 29/0623* (2013.01);
(Continued)

(58) Field of Classification Search
CPC . H01L 27/0921; H01L 24/48; H01L 29/0623; H01L 29/0638; H01L 29/1083;
(Continued)

(56) References Cited

U.S. PATENT DOCUMENTS 6,825,700 B2 11/2004 Hano
8,148,774 B2 4/2012 Mori et al.
(Continued)

FOREIGN PATENT DOCUMENTS

JP 58210676 A 12/1983
JP 2-210862 A 8/1990
(Continued)

OTHER PUBLICATIONS

International Search Report (ISR) dated Sep. 12, 2017, in International Patent Application No. PCT/JP2017/023436 (4 pages).
(Continued)

*Primary Examiner* — Selim U Ahmed

(57) ABSTRACT

A method of manufacturing a semiconductor integrated circuit includes a first ion implantation process implanting impurity ions of a second conductivity type into a bottom surface of a semiconductor substrate by adjusting an acceleration voltage and a projection range for forming a first current suppression layer, and a second ion implantation process implanting impurity ions of a first conductivity type into the bottom surface of the semiconductor substrate by adjusting an acceleration voltage and a projection range for forming a second current suppression layer. The semiconductor integrated circuit includes a first well region of the first conductivity type and a second well region of the second conductivity type provided in an upper portion of the first well region. The first current suppression layer is
(Continued)

separated from the first well region and the second current suppression layer is provided under the first current suppression layer.

18 Claims, 15 Drawing Sheets

Related U.S. Application Data continuation of application No. PCT/JP2017/023436, filed on Jun. 26, 2017.

(51) Int. Cl.
    *H01L 29/06*     (2006.01)
    *H01L 29/10*     (2006.01)
    *H02M 1/08*     (2006.01)
    *H01L 21/8238*     (2006.01)
    *H01L 21/761*     (2006.01)

(52) U.S. Cl.
    CPC ...... *H01L 29/0638* (2013.01); *H01L 29/1083* (2013.01); *H01L 21/761* (2013.01); *H01L 21/823892* (2013.01); *H01L 29/0692* (2013.01); *H01L 29/1087* (2013.01); *H02M 1/08* (2013.01)

(58) Field of Classification Search
    CPC ......... H01L 21/823892; H01L 29/1087; H01L 29/0692; H01L 21/761; H01L 2924/00014; H01L 2224/73265; H01L 2224/29339; H01L 2224/29199; H01L 2224/32237; H01L 2224/48237; H02M 1/08
    See application file for complete search history.

(56) References Cited

U.S. PATENT DOCUMENTS

| | | | |
|---|---|---|---|
| 8,148,809 B2 | 4/2012 | Senda et al. | |
| 8,304,827 B2 | 11/2012 | Nakamura et al. | |
| 9,117,797 B2 | 8/2015 | Yamaji et al. | |
| 9,608,072 B2 | 3/2017 | Kanno et al. | |
| 2003/0218186 A1* | 11/2003 | Hano | H01L 27/0629 257/197 |
| 2008/0237707 A1* | 10/2008 | Suzuki | H01L 29/1083 257/344 |
| 2010/0102420 A1 | 4/2010 | Mori et al. | |
| 2010/0163973 A1 | 7/2010 | Nakamura et al. | |
| 2010/0176480 A1 | 7/2010 | Senda et al. | |
| 2013/0105904 A1* | 5/2013 | Roybal | H01L 21/823892 257/369 |
| 2014/0264583 A1 | 9/2014 | Yamaji et al. | |
| 2015/0027111 A1 | 1/2015 | Steinberger et al. | |
| 2016/0056148 A1 | 2/2016 | Kanno et al. | |

FOREIGN PATENT DOCUMENTS

| | | |
|---|---|---|
| JP | 200447937 A | 2/2004 |
| JP | 2010108959 A | 5/2010 |
| JP | 2010157636 A | 7/2010 |
| JP | 2011103429 A | 5/2011 |
| JP | 201642558 A | 3/2016 |
| WO | 2013073539 A1 | 5/2013 |
| WO | 2014058028 A1 | 4/2014 |

OTHER PUBLICATIONS

English Translation by WIPO of International Preliminary Report on Patentability dated Feb. 21, 2019, in International Patent Application No. PCT/JP2017/023436 (6 pages).
Restriction Requirement Office Action dated Oct. 9, 2019, in U.S. Appl. No. 16/043,889.
Non-Final Office Action dated Feb. 21, 2020, in U.S. Appl. No. 16/043,889.
Notice of Allowance dated Jul. 15, 2020, in U.S. Appl. No. 16/043,889.

* cited by examiner

METHOD OF MANUFACTURING SEMICONDUCTOR INTEGRATED CIRCUIT

CROSS-REFERENCE TO RELATED APPLICATIONS

This application is a Divisional of U.S. patent application Ser. No. 16/043,889, filed on Jul. 24, 2018, which is a Continuation of International Application No. PCT/JP2017/023436, filed on Jun. 26, 2017, which claims the benefit of priority to Japanese Patent Application No. 2016-158763, filed on Aug. 12, 2016. The entire contents of each of U.S. patent application Ser. No. 16/043,889, International Application No. PCT/JP2017/023436, and Japanese Patent Application No. 2016-158763, are incorporated herein by reference in their entirety.

BACKGROUND

1. Field

The present invention relates to a semiconductor integrated circuit, which serves as a high voltage integrated circuit (HVIC) for controlling a power switching element.

2. Description of Related Art

In general, a power switching element of a power conversion bridge circuit is driven by a HVIC in a lower-power capability inverter. In general, the HVIC includes, for example, a high-side driving circuit, a low-side driving circuit, a level shifter, and a control circuit. The HVIC transmits driving signals for turning on and off gates of power switching elements from output terminals according to a signal fed from the input terminal. In the power conversion bridge circuit, a high-side power switching element and a low-side power switching element which receive the signals from the HVIC are respectively operated to perform power conversion.

The high-side driving circuit which drives a high-side power switching-element can be implemented a complementary MOS (CMOS) circuit including a p-channel MOSFET and an n-channel MOSFET. The high-side driving circuit operates, using a "VS-potential" as a reference potential and a "VB-potential" as a power-supply potential, and transmits a driving signal from an output terminal in accordance with a signal received from the level shift circuit. The VB-potential is the highest potential applied to the HVIC and is maintained at a level that is about 15 volts higher than the VS-potential by, for example, a bootstrap capacitor in a normal state in which the VB-potential is not affected by noise. The VS-potential is potential at an output node which is a connection point between the high-side power switching-element and the low-side power switching-element of the power conversion bridge circuit and is changed between zero volt and several hundreds of volts during a power conversion process. In some cases, the VS-potential is a negative potential.

In the HVIC, various types of noise generated by the operation of the power switching elements are likely to be fed. Therefore, it is important to improve noise immunity such that an operation error or an operation failure does not occur and to ensure high reliability in the design of the HVIC. It is necessary to suppress the operation of parasitic elements in order to improve noise immunity. In particular, it is important to suppress the operation of parasitic elements which are provided immediately below a high-side circuit arrangement area (in the vicinity of a driving circuit of n-channel MOSFET) in the vertical direction of the substrate. The reason is that the area of the parasitic elements provided in the vertical direction of the substrate is large and a large amount of current is likely to flow.

JP 2004-47937 A discloses a technique in which an n-type highly-doped buried region is provided between a p-type semiconductor substrate and an n-type semiconductor layer to suppress the operation of a parasitic p-n-p transistor. WO2014/058028 discloses a technique in which a p-channel MOSFET for clamp is provided in an n-type well region to suppress the operation of a parasitic p-n-p transistor.

SUMMARY

An object of the invention is to provide a semiconductor integrated circuit (HVIC) with a high noise immunity, which can suppress operations of parasitic elements and can improve a reliability of the HVIC, without requiring a complicated manufacturing process of the HVIC.

In order to achieve the object of the invention, an aspect of the invention inheres in a semiconductor integrated circuit encompassing (a) a first well region of a first conductivity type, (b) a second well region of a second conductivity type provided in an upper portion of the first well region, (c) a first current suppression layer of the second conductivity type being provided in a lower portion of a base-body, the first current suppression layer is disposed directly under the first well region being separated from the first well region and having an impurity concentration higher than that of the base-body, and (d) a second current suppression layer of the first conductivity type provided under the first current suppression layer in the lower portion of the base-body, a bottom of the second current suppression layer is exposed from a bottom surface of the base-body.

DESCRIPTION OF EMBODIMENTS

Figure 1:
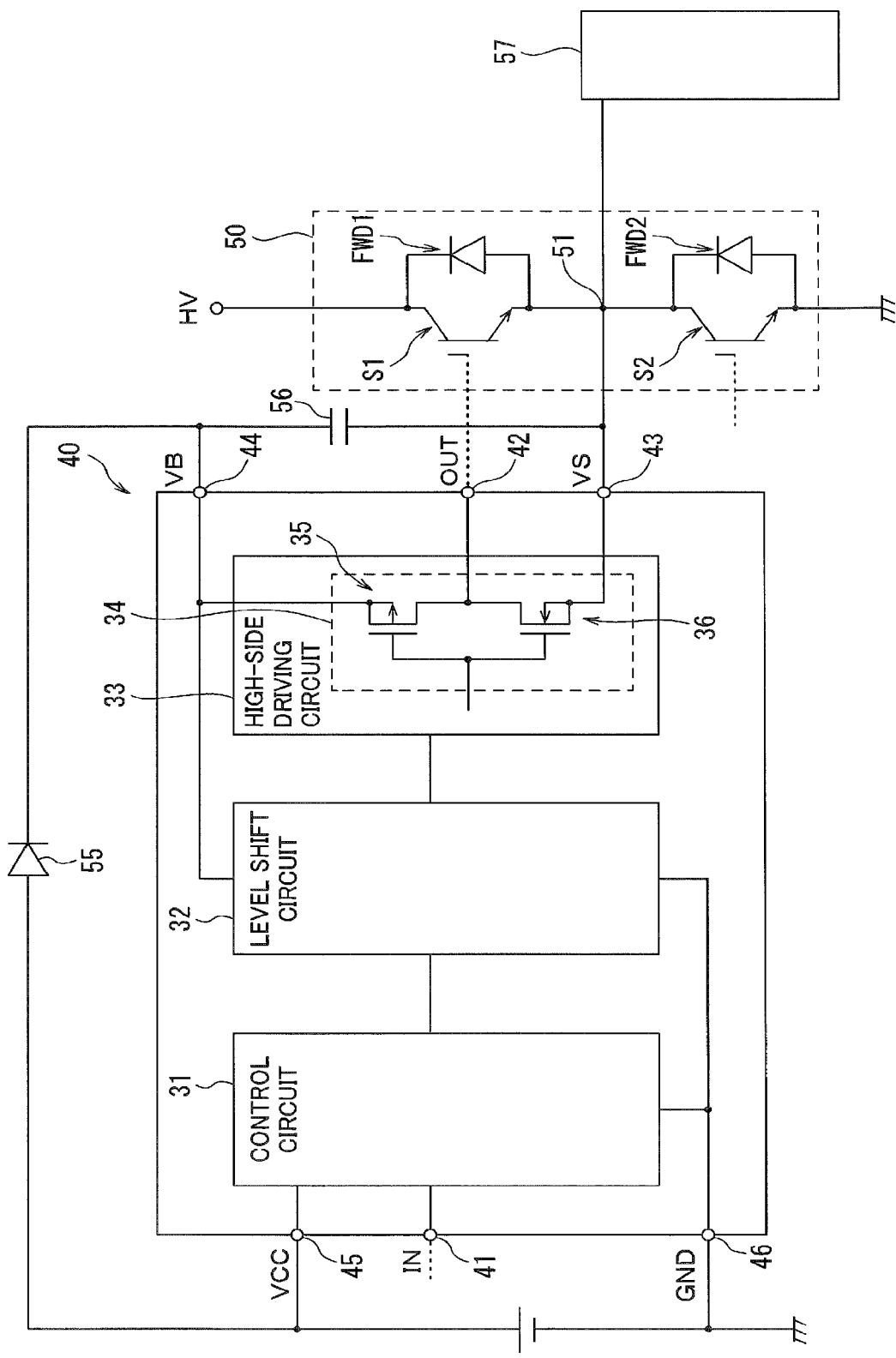
FIG. 1 is a circuit diagram schematically illustrating the structure of a semiconductor integrated circuit (HVIC) according to a first embodiment of the present invention.

With reference to the drawings, first to fourth embodiments of the present invention will be explained in detail below. In the following description of the drawings, the same or similar reference numerals are assigned to the same or similar portions. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

In the Specification, a "first main-electrode region" and a "third main-electrode region" are assigned to a semiconductor region which will be a source region or a drain region in a field-effect transistor (FET) or a static induction transistor (SIT), an emitter region or a collector region in an insulated gate bipolar transistor (IGBT) and an anode region or a cathode region in a static induction thyristor (SI Thy) or a gate turn-off thyristor (GTO). A "second main-electrode region" and a "fourth main-electrode region" are assigned to a semiconductor region which will not be the first main-electrode region and will be the source region or the drain region in the FET or the SIT, the emitter region or the collector region in the IGBT, and the anode region or the cathode region in the SI thyristor or the GTO.

That is, when the first main-electrode region and the third main-electrode region are the source region, the second main-electrode region and the fourth main-electrode region mean the drain region. When the first main-electrode region and the third main-electrode region are the emitter region, the second main-electrode region and the fourth main-electrode region mean the collector region. When the first main-electrode region and the third main-electrode region are the anode region, the second main-electrode region and the fourth main-electrode region mean the cathode region. In the following first to fourth embodiments, the description is focused on a HVIC using an insulated-gate field-effect transistor. Therefore, the source region is referred to as the "first main-electrode region" and "the third main-electrode region" and the drain region is referred to as the "second main-electrode region" and the "fourth main-electrode region".

In the following first to fourth embodiments, an example in which a first conductivity type is an n-type and a second conductivity type is a p-type will be described. However, the relationship between the conductivity types may be reversed such that the first conductivity type is a p-type and the second conductivity type is an n-type. In the Specification and the accompanying Drawings, symbols "+" and "−" added as superscripts to p or n mean that the impurity concentration of a semiconductor region is higher and lower than that of a semiconductor region without the symbols. In the following description, it is obvious that a member or a region which is added a "first conductivity type" or a "second conductivity type" means a member or a region made of a semiconductor material without clearly limitation, in technically and logically.

In the following description, the terms "top " and "lower" in, for example, "top surface" and "bottom surface" are defined depending on cross-sectional views. For example, when the direction of a semiconductor integrated circuit is changed by 90° and is then observed, the terms "top " and "bottom " change to "left" and "right", respectively. When the observing direction of the semiconductor integrated circuit is changed by 180°, the terms "top" and "bottom " shall be reversed.

First Embodiment

As illustrated in FIG. 1, a semiconductor integrated circuit 40 according to a first embodiment of the present invention is a HVIC including, for example, a control circuit 31, a level shift circuit 32, a high-side driving circuit 33, and a low-side driving circuit (not illustrated). In addition, the semiconductor integrated circuit 40 according to the first embodiment is the HVIC that drives a power conversion unit 50 corresponding to, for example, one phase of a power conversion bridge circuit. The semiconductor integrated circuit 40 according to the first embodiment transmits a driving signal from an output terminal 42 to turn on and off a gate of a power switching element implementing the power conversion unit 50, in response to a signal fed from an input terminal 41.

As illustrated in FIG. 1, in the power conversion unit 50, a high-side power switching-element (hereinafter, referred to as a "high-side switching-element") S1 and a low-side power switching-element (hereinafter, referred to as a "low-side switching-element") S2 are connected in series to implement an output circuit. In FIG. 1, the high-side switching-element S1 and the low-side switching-element S2 are, for example, IGBTs, respectively. The high-side switching-element S1 and the low-side switching-element S2 are not limited to be IGBTs. Another power switching elements may be used as the high-side switching-element S1 and the low-side switching-element S2. A freewheeling diode FWD1 is connected in parallel to the high-side switching-element S1 in a reverse direction, and another freewheeling diode FWD2 is connected in parallel to the low-side switching-element S2 in a reverse direction.

The high-side switching-element S1 and the low-side switching-element S2 are connected in series between a high-voltage main power supply HV which is on the positive electrode side and a ground (GND) potential which is on the negative electrode side of the main power supply HV. A VS-terminal 43 to which the VS-potential is applied as a second potential is connected to a connection point 51 between the high-side switching-element S1 and the low-side switching-element S2. The connection point 51 is an output point of the power conversion unit 50 corresponding to one phase of the power conversion bridge circuit. The low-side switching-element S2 is connected between the connection point 51 and the GND potential. For example, a motor is connected as a load 57 to the connection point 51.

While the semiconductor integrated circuit 40 is operating, the VS-potential applied to the VS-terminal 43 is repeatedly raised and dropped between the high-potential-side potential (for example, about 400 volts) and the low-potential-side potential (GND potential) of the main power supply HV by the complementary turn-on and turn-off of the high-side switching-element S1 and the low-side switching-element S2 implementing the output circuit and is changed from zero volt to several hundreds of volts.

The high-side driving circuit 33 includes a gate driving circuit 34. The gate driving circuit 34 is, for example, a CMOS circuit implemented by an n-channel MOSFET (hereinafter, referred to as an "nMOS transistor") 36 as a first active element and a p-channel MOSFET (hereinafter, referred to as a "pMOS transistor") 35 as a second active element. Specifically, a source of the pMOS transistor 35 is connected to the VB-terminal 44 and a drain of the pMOS transistor 35 is connected to a drain of the nMOS transistor 36. A source of the nMOS transistor 36 is connected to the VS-terminal 43.

The gate driving circuit 34 operates, using the VS-potential applied to the VS-terminal 43 as a reference potential and the VB-potential which is applied as a first potential to the VB-terminal 44, as a power-supply potential and transmits a driving signal from the output terminal 42 in accordance with a signal received from the level shift circuit 32 to drive the high-side switching-element S1.

The control circuit 31 operates, using the GND potential applied to a ground (GND) terminal 46 as the reference potential and a VCC-potential applied to a VCC-terminal 45 as the power-supply potential, and generates a low-side-level on/off signal for turning on and off the high-side switching-element S1 and a low-side-level on/off signal for turning on and off the low-side switching-element S2. The GND potential is a common potential.

The level shift circuit 32 converts the low-side-level on/off signal generated by the control circuit 31 into a high-side-level on/off signal.

In the semiconductor integrated circuit 40 according to the first embodiment, when the high-side switching-element S1 is driven, the control circuit 31 generates the low-side-level on/off signal for turning on and off the high-side switching-element S1. The low-side-level on/off signal is converted into the high-side-level on/off signal by the level shift circuit 32 and the high-side-level on/off signal is fed to the high-side driving circuit 33.

The on/off signal which is fed from the control circuit 31 to the high-side driving circuit 33 is fed to a gate of the high-side switching-element S1 through the gate driving circuit 34. The high-side switching-element S1 is turned on and off on the basis of the on/off signal from the control circuit 31.

A bootstrap diode 55 which is an external element is connected to between the VCC-terminal 45 and the VB-terminal 44. In addition, a bootstrap capacitor 56 which is an external element is connected between the VB-terminal 44 and the VS-terminal 43. The bootstrap diode 55 and the bootstrap capacitor 56 generate power for driving the high-side switching-element S1.

The VB-potential is the highest potential applied to the semiconductor integrated circuit 40 and is maintained at a level that is about 15 volts higher than the VS-potential by the bootstrap capacitor 56 in a normal state in which the VB-potential is not affected by noise. The VS-potential is potential at the connection point (output node) 51 between the high-side switching-element S1 and the low-side switching-element S2 of the power conversion bridge circuit and is changed between zero volt and several hundreds of volts during a power conversion process. In some cases, the VS-potential is a negative potential.

Figure 2:
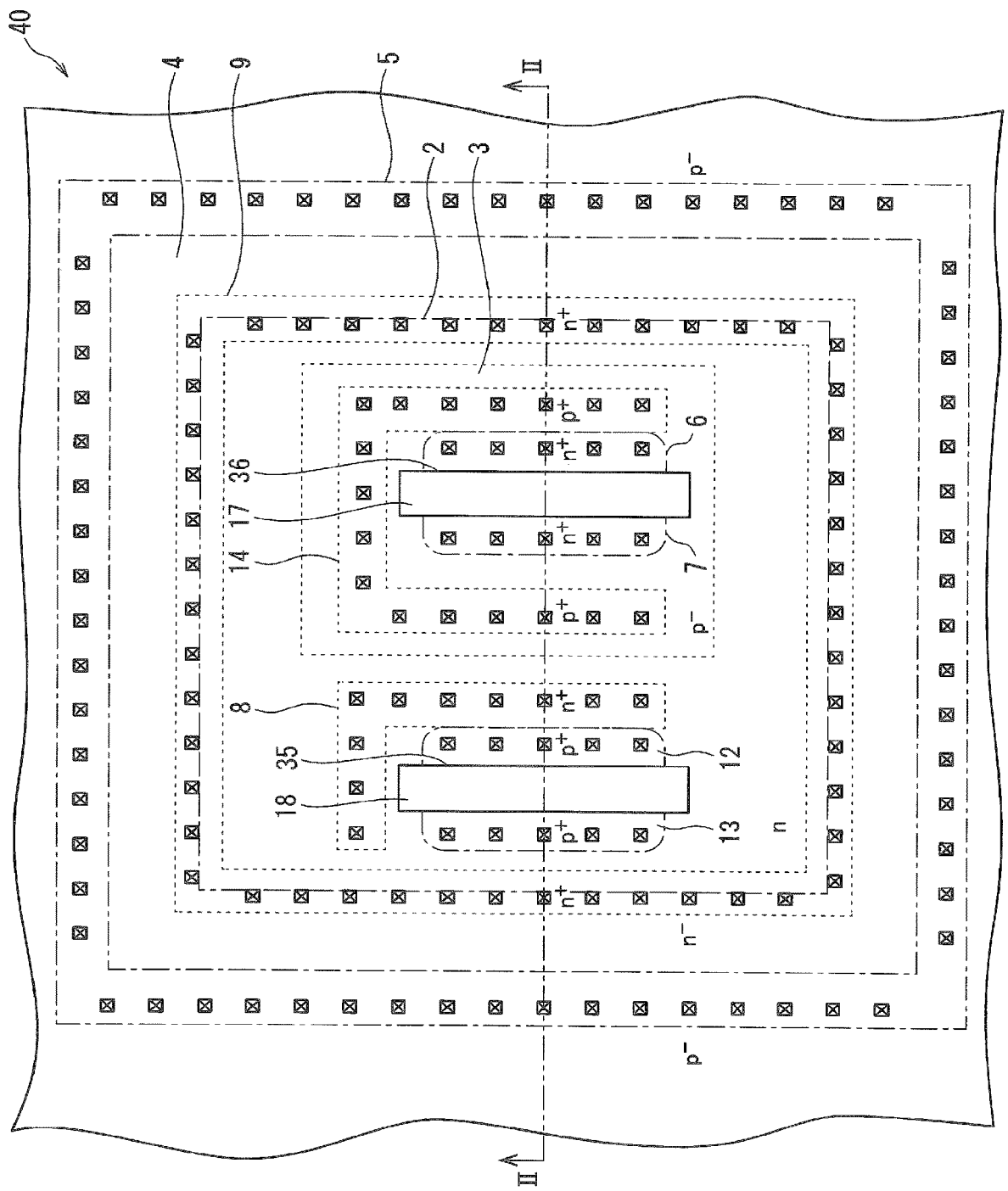
FIG. 2 is a plan view illustrating a main portion of the planar layout focused on a high-side circuit arrangement area of the HVIC according to the first embodiment of the present invention.
Figure 3:
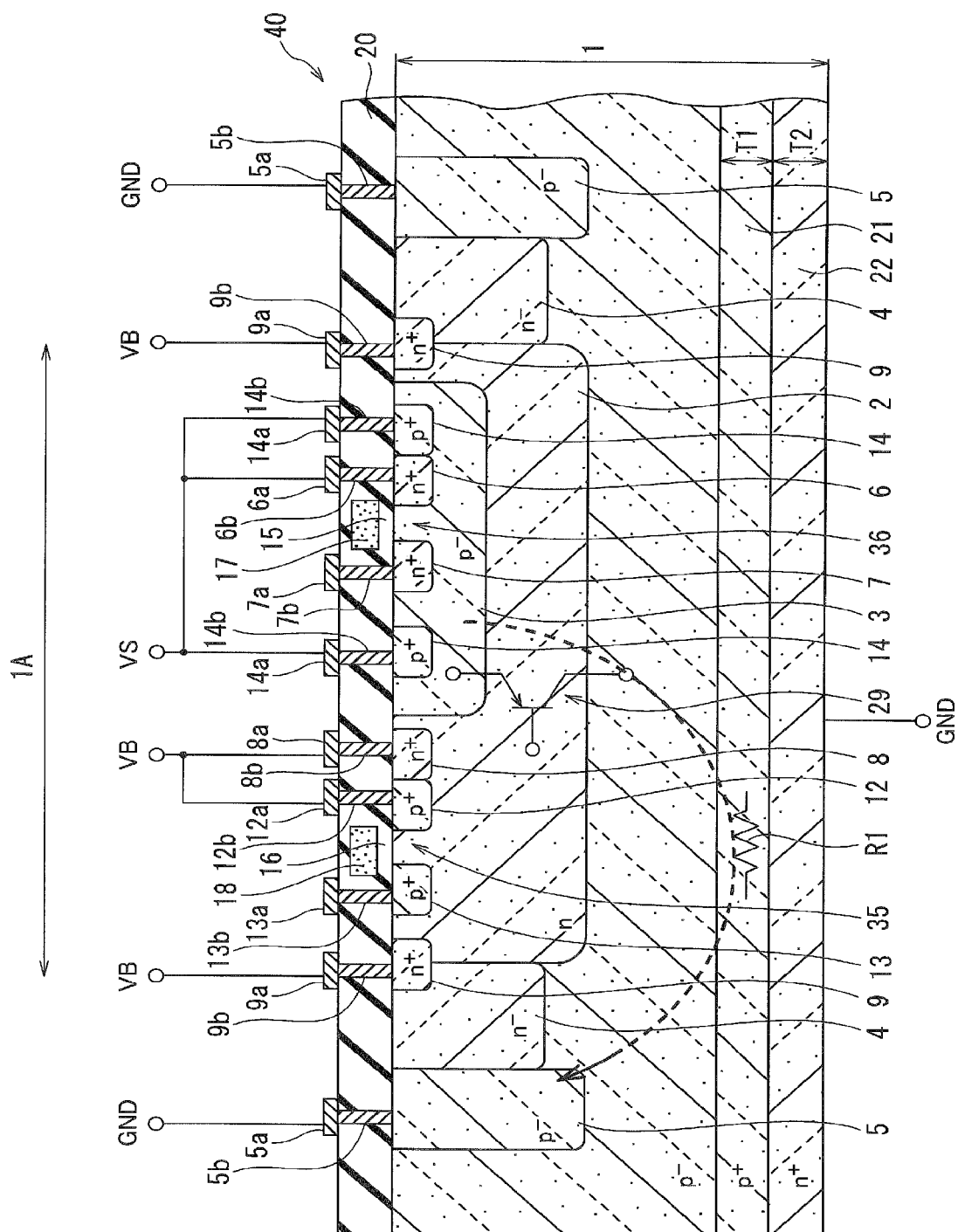
FIG. 3 is a cross-sectional view illustrating a main portion of a cross-sectional structure taken along the line II-II of FIG. 2.

Next, the detailed structure of the semiconductor integrated circuit 40 according to the first embodiment will be explained. As illustrated in FIGS. 2 and 3, the semiconductor integrated circuit 40 according to the first embodiment is the HVIC, in which an element isolation structure is provided on a base-body 1 implemented by a semiconductor substrate of a second conductivity type (p-type) by a self-isolation scheme of IC process. The semiconductor substrate implementing the base-body 1 is, for example, a single-crystalline silicon substrate having a specific resistance of about 100 Ω cm or more.

As illustrated in FIG. 3, a first well region 2 of a first conductivity type (n-type) is selectively buried in an upper part—surface layer portion—that is close to a top surface, or a main surface of the base-body 1, and a second well region 3 of the second conductivity type (p$^-$-type) is selectively buried in an upper part of the first well region 2. In addition, a breakdown-voltage improving-region (well region) 4 of the first conductivity type (n$^-$-type) and an isolation region 5 of the second conductivity type (p$^-$-type) are selectively buried in the upper part of the base-body 1. The first well region 2 and the second well region 3 are buried in a high-side circuit arrangement-area 1A of the base-body 1. The first well region 2 has an impurity concentration of, for example, about $1 \times 10^{14}/cm^3$ to $1 \times 10^{17}/cm^3$. The second well region 3 has an impurity concentration of, for example, about $1 \times 10^{14}/cm^3$ to $1 \times 10^{18}/cm^3$.

As illustrated in FIG. 2 and FIG. 3, the first well region 2 is surrounded by the breakdown-voltage improving-region 4 and comes into contact with the breakdown-voltage improving-region 4. The breakdown-voltage improving-region 4 is surrounded by the isolation region 5 and comes into contact with the isolation region 5. That is, the breakdown-voltage improving-region 4 is provided between the first well region 2 and the isolation region 5 and comes into contact with the first well region 2 and the isolation region 5. The breakdown-voltage improving-region 4 has a lower impurity concentration than the first well region 2. The isolation region 5 has a higher impurity concentration than the base-body 1.

As illustrated in FIG. 3, the pMOS transistor 35 is an active element that is provided in the upper part of the n type first well region 2. The nMOS transistor 36 is an active element that is provided in the upper part of the p-type second well region 3. The first well region 2 is an isolation region that electrically isolates the pMOS transistor 35 from the base-body 1 and the second well region 3 is an isolation region that electrically isolates the nMOS transistor 36 from the first well region 2.

The pMOS transistor 35 includes a first main-electrode region (source region) 12 of p-type which is selectively buried in the upper part of the first well region 2 and a second main-electrode region (drain region) 13 of p-type which is selectively buried in the upper part of the first well region 2 being separated from the first main-electrode region 12, such that the channel formation regions can be interposed between the first main-electrode region 12 and the second main-electrode region 13. In addition, pMOS transistor 35 includes a gate insulating film 16 which is selectively laminated on the top surface of the channel formation region, and a gate electrode 18 which is provided over the channel formation region with the gate insulating film 16 interposed between the gate electrode 18 and the channel formation region.

The nMOS transistor 36 includes a third main-electrode region (source region) 6 of n-type which is selectively buried in the upper part of the second well region 3 and a fourth main-electrode region (drain region) 7 of n-type which is selectively buried in the upper part of the second well region 3 being separated from the third main-electrode region 6, such that the channel formation regions can be interposed between the third main-electrode region 6 and the fourth main-electrode region 7. In addition, the nMOS transistor 36 includes a gate insulating film 15 which is selectively laminated on the top surface of the second well region 3, and a gate electrode 17 which is provided over the channel formation region with the gate insulating film 15 interposed between the gate electrode 17 and the channel formation region.

The gate insulating films 15 and 16 are, for example, silicon dioxide films. The gate electrodes 17 and 18 are, for example, doped polysilicon films into which impurities are doped for reducing a resistivity Each of the first main-electrode region 12 and the second main-electrode region 13 of the pMOS transistor 35 has a higher impurity concentration than the first well region 2. Each of the third main-electrode region 6 and the fourth main-electrode region 7 of the nMOS transistor 36 has a higher impurity concentration than the second well region 3.

Examples of the silicon dioxide film include a thermally oxidized film which is formed by a thermal oxidation method or a deposited oxide film which is formed by a chemical vapor deposition (CVD) method. It is preferable that the thermally oxidized film with highly densified structure be used as the gate insulating films 15 and 16 in the MOS transistors. In the first embodiment, the MOS transistors in which the gate insulating films 15 and 16 are silicon dioxide films are described. However, the transistor may be a MIS transistor in which the gate insulating film is a silicon nitride film or a stacked film of a silicon nitride film and a silicon oxide film.

As illustrated in FIG. 3, an n$^+$-type first contact region 8 which has a higher impurity concentration than the first well region 2 is selectively buried in the upper part of the first well region 2. An n$^+$-type third contact region 9 is selectively buried in the upper parts of the first well region 2 and the breakdown-voltage improving-region 4 so as to bridge the first well region 2 and the breakdown-voltage improving-region 4. The third contact region 9 has a higher impurity concentration than the first well region 2 and the breakdown-voltage improving-region 4. A p$^+$-type second contact region 14 which has a higher impurity concentration than the second well region 3 is selectively buried in the upper part of the second well region 3.

As illustrated in FIG. 3, an interlayer insulating film 20 is laminated on the top surface of the base-body 1 so as to cover the gate electrodes 17 and 18. A ground electrode 5a, a third main-electrode 6a, a fourth electrode 7a, a first contact electrode 8a, a third contact electrode 9a, a first main-electrode 12a, a second main-electrode 13a, and a second contact electrode 14a are laminated on the interlayer insulating film 20. The electrodes 5a, 6a, 7a, 8a, 9a, 12a, 13a, and 14a are made of, for example, aluminum films or aluminum alloy film.

As illustrated in FIG. 3, the ground electrode 5a is electrically connected to the isolation region 5 through a conductive plug 5b which is buried in the interlayer insulating film 20. The third main-electrode 6a is electrically connected to the third main-electrode region 6 which is a semiconductor region through a conductive plug 6b which is buried in the interlayer insulating film 20. The fourth main-electrode 7a is electrically connected to the fourth main-electrode region 7 which is a semiconductor region through a conductive plug 7b which is buried in the interlayer insulating film 20.

As illustrated in FIG. 3, the first contact electrode 8a is electrically connected to the first contact region 8 through a conductive plug 8b which is buried in the interlayer insulating film 20. The third contact electrode 9a is electrically connected to the third contact region 9 through a conductive plug 9b which is buried in the interlayer insulating film 20.

As illustrated in FIG. 3, the first main-electrode 12a is electrically connected to the first main-electrode region 12 through a conductive plug 12b which is buried in the interlayer insulating film 20. The second main-electrode 13a is electrically connected to the second main-electrode region 13 through a conductive plug 13b which is buried in the interlayer insulating film 20. The second contact electrode 14a is electrically connected to the second contact region 14 through a conductive plug 14b which is buried in the interlayer insulating film 20.

As can be seen from FIG. 1 and FIG. 3, the ground electrode 5a is electrically connected to the GND terminal 46 illustrated in FIG. 1 and the GND potential is applied to the ground electrode 5a through the GND terminal 46. The third main-electrode 6a and the second contact electrode 14a are electrically connected to the VS-terminal 43 illustrated in FIG. 1 and the VS-potential is applied to the third main-electrode 6a and the second contact electrode 14a through the VS-terminal 43. The first contact electrode 8a, the third contact electrode 9a, and the first main-electrode 12a are electrically connected to the VB-terminal 44 illustrated in FIG. 1 and the VB-potential is applied to the first contact electrode 8a, the third contact electrode 9a, and the first main-electrode 12a through the VB-terminal 44.

That is, the GND potential is applied as the reference potential to the isolation region 5. In addition, the VB-potential which is different from the GND potential is applied as the first potential to the first well region 2 and the breakdown-voltage improving-region 4 through the third contact region 9 which is provided across the first well region 2 and the breakdown-voltage improving-region 4 and the first contact region 8 buried in the first well region 2. The VS-potential which is different from the GND potential and the VB-potential is applied as the second potential to the second well region 3 through the second contact region 14. The VB-potential is applied to the first main-electrode region 12 of the pMOS transistor 35 and the VS-potential is applied to the third main-electrode region 6 of the nMOS transistor 36.

As illustrated in FIG. 2, the first contact region 8 has an L-shape in a plan view and is provided such that a first portion which extends along a gate width direction (the longitudinal direction of the gate electrode 18) of the pMOS transistor 35 comes into contact with the first main-electrode region 12 of the pMOS transistor 35 and a second portion which extends from the first portion along a gate length direction (the width direction of the gate electrode 18) of the pMOS transistor 35 is separated from the first main-electrode region 12 and the second main-electrode region 13 of the pMOS transistor 35.

As illustrated in FIG. 2, the second contact region 14 has a U-shape in a plan view and is provided so as to surround the nMOS transistor 36. The second contact region 14 is provided such that a first portion which extends in a gate width direction (the longitudinal direction of the gate electrode 17) of the nMOS transistor 36 comes into contact with the third main-electrode region 6 of the nMOS transistor 36 and a second portion which extends from the first portion along a gate length direction (the longitudinal direction of the gate electrode 17) of the nMOS transistor 36 and a third portion which extends from the second portion along a gate width direction of the nMOS transistor 36 are separated from the third main-electrode region 6 and the fourth main-electrode region 7 of the nMOS transistor 36.

The third contact region 9 has a ring-shaped plane pattern that extends in a ring shape so as to surround the pMOS transistor 35 and the nMOS transistor 36.

As illustrated in FIG. 3, in the lower portion of the base-body 1, a first current suppression layer 21 of the second conductivity type (p$^+$-type) is provided to be separated from the first well region 2. Although not illustrated in detail, the first current suppression layer 21 is provided on the entire lower surface of the base-body 1 to be in parallel to the lower surface of the base-body 1 and to face the entire bottom of the first well region 2. The first current suppression layer 21 has an impurity concentration higher than that of the base-body 1 and has the impurity concentration of, for example, about $1\times10^{14}$ to $1\times10^{21}$/cm$^3$. The first current suppression layer 21 is also separated from the breakdown-voltage improving-region 4 and the isolation region 5.

Furthermore, a second current suppression layer 22 of a first conductivity type (n$^+$-type) is provided under the first current suppression layer 21. The upper surface of the second current suppression layer 22 is in contact with the first current suppression layer 21, and the lower surface of the second current suppression layer 22 is exposed from the lower surface of the base-body 1. Although not illustrated in detail, the second current suppression layer 22 is provided on the entire lower surface of the base-body 1 and faces the entire bottom of the first well region 2. The second current suppression layer 22 has an impurity concentration higher than that of the base-body 1 and has the impurity concentration of, for example, about $1\times10^{14}$ to $1\times10^{21}$/cm$^3$. The second current suppression layer 22 is also separated from the breakdown-voltage improving-region 4 and the isolation region 5. For example, the thickness T1 of the first current suppression layer 21 is approximately the same as the thickness T2 of the second current suppression layer 22.

As an example of a method of forming the first current suppression layer 21 and the second current suppression layer 22, p-type impurity ions such as boron (B) are implanted with high energy into the entire lower portion at the bottom surface of the base-body 1. After that, the implanted ions are activated by annealing, and the first current suppression layer 21 is formed by further thermally diffusing the activated p-type impurity elements to a desired depth. Then, n-type impurity ions such as arsenic (As) or phosphorus (P) are ion-implanted into the entire lower portion at the bottom surface of the base-body 1 in a projection range shallower than the first current suppression layer 21 as measured from the bottom surface of the base-body 1. After that, the implanted ions are activated by annealing, so that the second current suppression layer 22 is formed.

That is, the semiconductor integrated circuit 40 according to the first embodiment includes the first current suppression layer 21 and the second current suppression layer 22 is provided in the lower portions of the semiconductor substrate, immediately below the first well region 2, so as to be separated from the first well region 2 as illustrated in FIG. 3. Therefore, a built-in potential of a p-n junction interface between the first current suppression layer 21 and the second current suppression layer 22 is established in the base-body 1 under the first well region 2, and a potential barrier due to a potential difference is formed.

Figure 4:
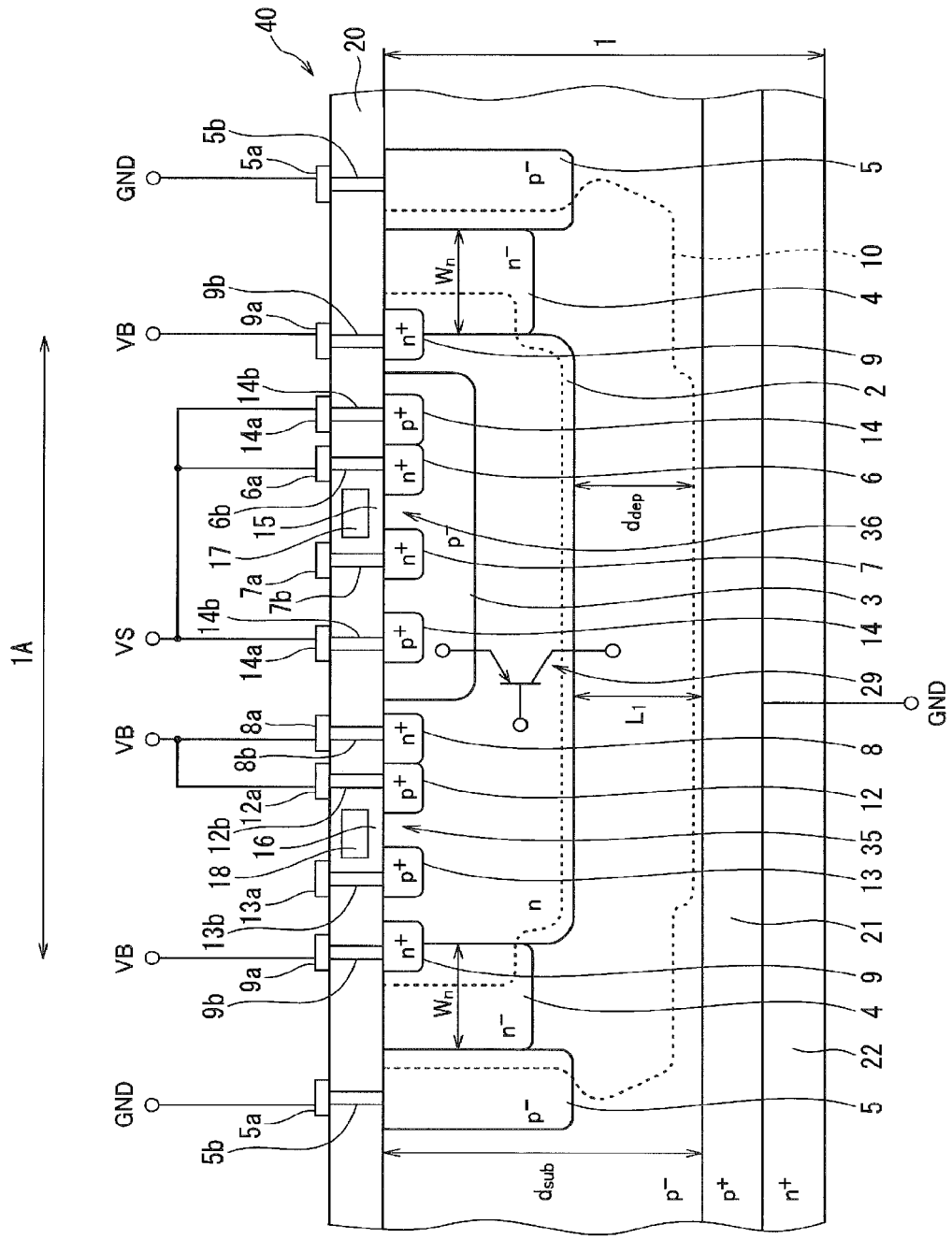
FIG. 4 is a cross-sectional view illustrating a main portion of the spreading of a depletion layer in the HVIC according to the first embodiment of the present invention.

During the normal operation of the semiconductor integrated circuit 40, as illustrated in FIG. 4, depletion layers 10 are formed in the p-n junction interfaces between the p-type semiconductor regions of the substrate 1 and the isolation region 5, and the n-type semiconductor regions of the first well region 2 and the breakdown-voltage improving-region 4. When the depletion layer 10 comes into contact with the first current suppression layer 21, a potential distribution is changed, which causes a reduction in the breakdown voltage. Therefore, in the semiconductor integrated circuit 40 according to the first embodiment, the thickness $d_{sub}$ of the base-body 1 is set to a value at which the depletion layer 10 does not reach the first current suppression layer 21, that is, the depletion layer 10 is separated from the first current suppression layer 21. Note that the effectiveness of the current suppression can be obtained as long as the depletion layer 10 does not reach the second current suppression layer 22. Therefore, a structure in which the depletion layer 10 comes into contact with the first current suppression layer 21 can be adapted in the case that a reduction in the breakdown voltage is tolerable.

In the semiconductor integrated circuit 40, mainly two rated breakdown voltages of 600 volts and 1200 volts are designed. The length $d_{dep}$ of the depletion layer 10 is about 150 micrometers when the VS-potential is 600 volts and is about 200 micrometers when the VS-potential is 1200 volts. Each of the thickness T1 of the first current suppression layer 21 and the thickness T2 of the second current suppression layer 22 is about 0.5 micrometer to 20 micrometers. Since the depth of the first well region 2 is about 10 micrometers, the thickness $d_{sub}$ from the base-body 1 to the first current suppression layer 21 is set such that the depletion layer 10 is separated from the first current suppression layer 21, considering the depth of the first well region 2.

When the rated breakdown voltage is designed to be 600 volts, the thickness $d_{sub}$ of the base-body 1 is preferably equal to or greater than about 160 micrometers. When the rated breakdown voltage is designed to be 1200 volts, the thickness $d_{sub}$ of the base-body 1 is preferably equal to or greater than 210 micrometers. In other words, a distance $L_1$ between the bottom of the first well region 2 and the first current suppression layer 21 is preferably equal to or greater than 150 micrometers when the VS-potential is 600 volts, is preferably equal to or greater than 200 micrometers when the VS-potential is 1200 volts.

Figure 5:
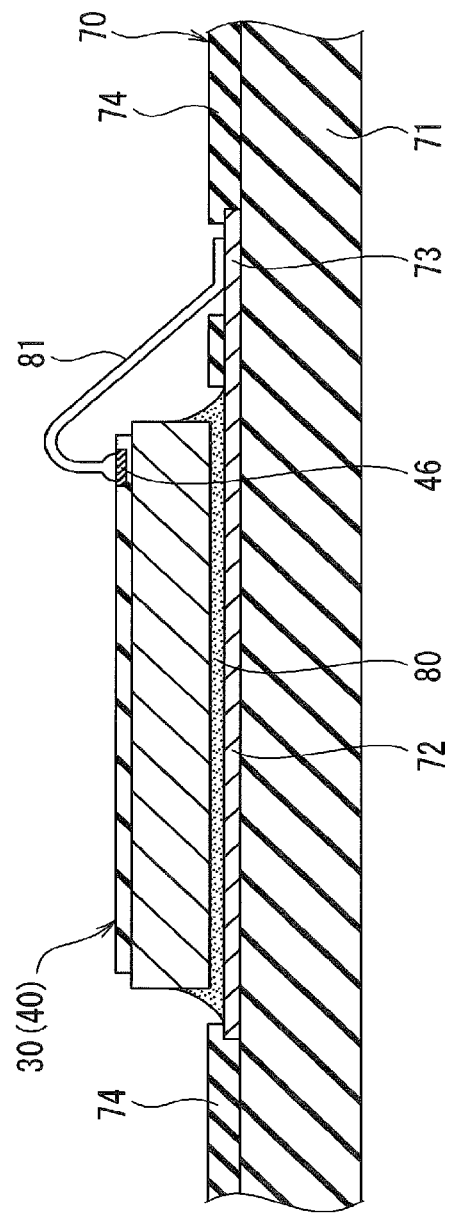
FIG. 5 is a cross-sectional view illustrating a main portion of a state in which the HVIC according to the first embodiment of the present invention is mounted on a wiring substrate.

As a semiconductor chip 30, the semiconductor integrated circuit 40 according to the first embodiment is mounted on a wiring substrate 70, as illustrated in FIG. 5. The wiring substrate 70 includes a core base 71 which is made of an insulating material, such as ceramics, and a die pad 72 and a wire connection portion 73 which are laminated on a top surface of the core base 71 and are made of a conductive metallic material. The die pad 72 and the wire connection portion 73 are integrally formed and are electrically connected to each other. In addition, a protective film 74 which is made of an insulating material is laminated on the top surface of the core base 71. The die pad 72 and the wire connection portion 73 are exposed through opening portions cut in the protective film 74.

The semiconductor chip 30 is bonded and fixed to the die pad 72 through an adhesive 80 which is made of, for example, conductive silver paste and is provided between the bottom surface of the base-body 1 and the top surface of the die pad 72. The GND terminal 46 is laminated on the top surface of the semiconductor chip 30. The GND terminal 46 is electrically connected to the wire connection portion 73 through a bonding wire 81.

The GND potential is applied to the die pad 72 and the wire connection portion 73, which is not illustrated in FIG. 5. In this case, since the GND potential is applied to the bottom surface of the base-body 1, the GND potential is also applied to the second current suppression layer 22. The objective of the application of the GND potential to the bottom surface of the base-body 1 is to prevent the effect of the stray capacitance of the semiconductor chip 30 from affecting other semiconductor chips or circuits, after the semiconductor chip 30 is mounted on the wiring substrate 70, or to stabilize power-supply potential in the semiconductor chip 30.

The VB-potential of the first potential and the VS-potential of the second potential are applied so that the p-n junction interface between the first well region 2 and the second well region 3 can be reversely biased, during the normal operation of the semiconductor integrated circuit 40.

The semiconductor integrated circuit 40 according to the first embodiment is manufactured by a self-isolation scheme of IC process. In the semiconductor integrated circuit 40 manufactured by the self-isolation scheme of IC process, as illustrated in FIG. 3, a parasitic p-n-p bipolar transistor 29 including the p-second well region 3, the n-type first well region 2, and the p-base-body 1 is established in the high-side circuit arrangement-area 1A. The base, emitter, and collector of the parasitic p-n-p bipolar transistor 29 are connected to the VB-terminal 44, the VS-terminal 43, and the GND terminal 46, respectively.

During the normal operation of the semiconductor integrated circuit 40, since the VB-potential as the power-supply potential is higher than the VS-potential, which is an intermediate potential, the parasitic p-n-p bipolar transistor 29 does not operate. However, the parasitic p-n-p bipolar transistor 29 is turned on when the VB-potential is lower than the VS-potential by 0.6 volt, which is the built-in potential of the p-n junction interface of silicon, or more due to a negative voltage surge, that is, when the following potential relationship is satisfied:

$$\text{VB-potential} < (\text{VS-potential} - 0.6 \text{ volt}) \quad (1)$$

The reason why the potential relationship of Eq. (1) is satisfied will be explained. As illustrated in FIG. 1, when the power conversion unit 50 is driven in the semiconductor integrated circuit 40, for example, the bootstrap capacitor 56 which is an external element is connected between the VB-terminal 44 and the VS-terminal 43. The potential difference (the voltage between VB and VS) between the VB-potential applied to the VB-terminal 44 and the VS-potential applied to the VS-terminal 43 is maintained by charge stored in the bootstrap capacitor 56. For example, the bootstrap diode 55 and other wires are connected to the VB-terminal 44. The load 57 and other wires are connected to the VS-terminal 43.

As different circuits are connected to the VB-terminal 44 and the VS-terminal 43, different values of parasitic capacitances are added respectively to the VB-terminal 44 and the VS-terminal 43. Therefore, in some cases, when the VB-potential varies, it is difficult for the VS-potential to sufficiently follow the variation of the VB-potential. As a result, when the VB-potential is changed by a negative voltage surge, it may be difficult to maintain the potential difference between the VB-potential and the VS-potential. Therefore, when the difference between a variation in the VB-potential and a variation in the VS-potential is large, Eq. (1) can be satisfied.

Herein, the case where the VB potential becomes lower than the VS potential by 0.6 volt or more due to the surge, and thus, the parasitic p-n-p bipolar transistor 29 is turned on in a conventional HVIC will be described with reference to FIG. 3. Since the conventional HVIC has a structure where the first current suppression layer 21 and the second current suppression layer 22 illustrated in FIG. 3 do not exist, in the case where the potential of the lower surface of the base-body 1 is fixed by the application of the GND potential, a current path is formed between the VS terminal 43 to which the high voltage of the high-side circuit (high-potential-side potential of HV) is applied and the GND terminal 46, that is, from the second well region 3 to the lower surface of the base-body 1. At this time, the parasitic p-n-p bipolar transistor 29 in the vertical direction to the substrate has a large area, and the area of the current path from the second well region 3 to the lower surface of the base-body 1 is also large, so that a large current flows. For this reason, malfunction or defective operation occurs in the semiconductor integrated circuit 40 due to heat generation caused by a large current, which becomes a factor of deteriorating the reliability.

Figure 15:
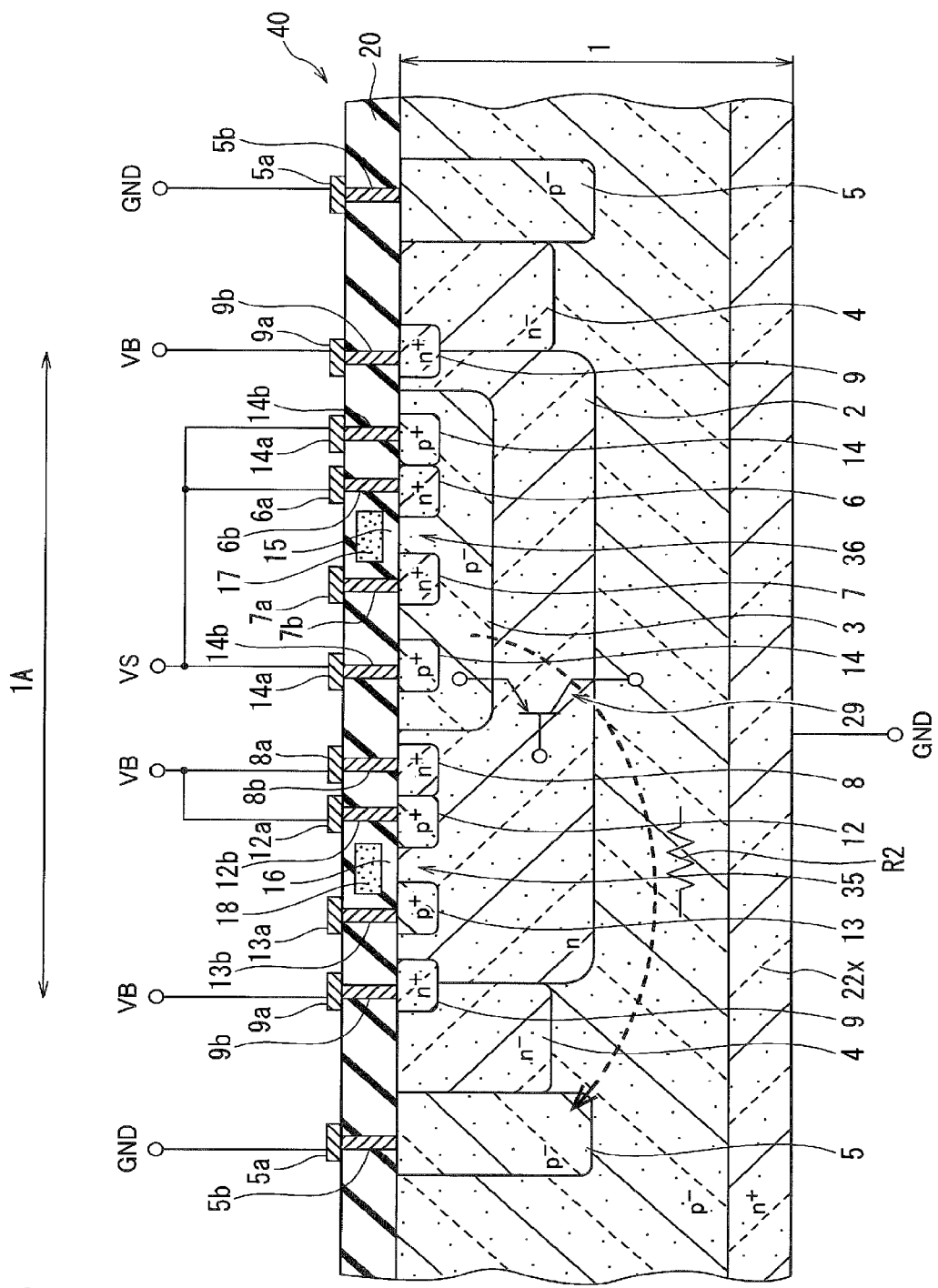
FIG. 15 is a cross-sectional view illustrating a main portion of a semiconductor integrated circuit according to a comparative example.

In contrast, as illustrated as a comparative example in FIG. 15, a semiconductor integrated circuit having a structure where an $n^+$-type current suppression layer 22x is provided in a lower portion of the base-body 1 is considered. In the semiconductor integrated circuit according to the comparative example, a potential barrier due to the potential difference of the p-n junction interface between the base-body 1 and the current suppression layer 22x exists between the first well region 2 and the lower surface of the base-body 1. There is a diffusion potential at the p-n junction interface, and even in the state where no bias is applied, the potential of the current suppression layer 22x becomes higher than the substrate potential of the region (base-body 1) between the first well region 2 and the current suppression layer 22x by about 0.6 volt (diffusion potential at the p-n junction interface of silicon).

Therefore, the potential barrier due to the current suppression layer 22x exists in the current path in the substrate-vertical direction of the parasitic p-n-p bipolar transistor 29 (the current path from the second well region 3 to the lower surface of the base-body 1), and the collector of the parasitic p-n-p bipolar transistor 29 is not directly connected to the lower surface of the base-body 1, so that it is possible to suppress the current, in other words, the movement of carriers flowing through the current path in the substrate-vertical direction.

For this reason, since the current amplification factor $H_{FE}$ of the parasitic p-n-p bipolar transistor 29 can be lowered, the operation of the parasitic p-n-p bipolar transistor 29 can be suppressed. As a result, it is possible to prevent malfunction or defective operation from occurring in the semiconductor integrated circuit 40 due to heat generation caused by a large current flowing due to the operation of the parasitic p-n-p bipolar transistor 29, so that it is possible to improve the reliability.

In addition, in the case where the VB potential drops by 0.6 volt or more from the VS potential due to the surge, the collector current of the parasitic p-n-p bipolar transistor 29 flows through the current path from the bottom of the first well region 2 through the base-body 1 to the isolation region 5 and is drawn to the ground electrode 5a to which the GND potential is applied, as indicated by a broken line arrow in FIG. 15. Since the resistance component of current path can be increased by increasing the width $W_n$ of the breakdown-voltage improving-region 4 between the first well region 2 and the isolation region 5, the current amplification factor $H_{FE}$ of the parasitic p-n-p bipolar transistor 29 can be lowered, so that the operation of the parasitic p-n-p bipolar transistor can be suppressed. The width $W_n$ of the breakdown-voltage improving-region 4 is usually about 100 micrometers in the 600 volts specification and about 200 micrometers in the 1200 volts specification in order to secure the breakdown-voltage. When the width $W_n$ of the breakdown-voltage improving-region 4 has such a value, the resistance component of the current path from the bottom of the first well region 2 through the base-body 1 to the breakdown-voltage improving-region 4 is high, so that the collector current of the parasitic p-n-p bipolar transistor 29 does not flow to the ground electrode 5a as a large current.

Herein, in the semiconductor integrated circuit according to comparative example illustrated in FIG. 15, the current suppression layer 22x is provided in the lower portion of the base-body 1. However, in the case where the VB potential becomes lower than the VS potential by 0.6 volt or more due to the surge, when the potential of the upper portion of the current suppression layer 22x increases, there is a concern that a current may flow in the vertical direction to the substrate due to the operation of the parasitic p-n-p bipolar transistor 29. In contrast, according to the HVIC according to the first embodiment, as illustrated in FIG. 3, since the p-type first current suppression layer 21 is provided above (on the upper side of) the n$^+$-type second current suppression layer 22, the potential barrier of the upper portion of the second current suppression layer 22 can be increased as compared with the semiconductor integrated circuit according to comparative example illustrated in FIG. 15. This is because the acceptor level of the p$^+$-type first current suppression layer 21 is closer to the valence band than that of the p$^-$-type base-body 1, and the difference between the donor level and the acceptor level increases.

Furthermore, in the semiconductor integrated circuit according to comparative example illustrated in FIG. 15, as indicated by a broken line arrow in FIG. 15, in the case where the VB potential becomes lower than the VS potential by 0.6 volt or more due to the surge, when the collector current of the parasitic p-n-p bipolar transistor 29 flows through the current path from the bottom of the first well region 2 through the base-body 1 to the isolation region 5, a potential difference occurs laterally due to the resistance R2 of the base-body 1. When the potential of the upper portion of the current suppression layer 22x increases due to the potential difference, the p-n junction formed by the p-type base-body 1 and the n$^+$-type current suppression layer 22x is forward biased, and thus, there is a concern that a current may flow in the GND electrode on the bottom surface. In contrast, according to the HVIC according to the first embodiment, as illustrated in FIG. 3, the p$^{30}$-type first current suppression layer 21 is provided above (on the upper side of) the n$^+$-type second current suppression layer 22, and the resistance R1 of the first current suppression layer 21 is smaller than the resistance of the base-body 1. For this reason, as indicated by a broken line arrow in FIG. 3, when the collector current of the parasitic p-n-p bipolar transistor 29 flows through the current path from the bottom of the first well region 2 through the base-body 1 or the first current suppression layer 21 to the isolation region 5, the potential difference in the lateral direction due to the resistance of the current path can be reduced. Therefore, the increase of the potential of the upper portion of the current suppression layer 22x due to this potential difference can be suppressed, and it is possible to prevent carriers (holes) from flowing in the vertical direction to the substrate and reaching the bottom surface.

As described above, according to the HVIC according to the first embodiment, the n$^+$-type second current suppression layer 22 is provided on the lower surface of the base-body 1, and the p$^+$-type first current suppression layer 21 is provided on the upper side of the second current suppression layer 22, so that the potential barrier of the upper portion of the second current suppression layer 22 can be formed as compared with the structure of comparative example illustrated in FIG. 15 where only the n$^+$-type current suppression layer 22x is formed. Furthermore, even in the case where carriers (holes) flow in the lateral direction and the potential of the upper portion of the second current suppression layer 22 increases, it is possible to make it difficult for a current to flow to the GND electrode on the bottom surface of the base-body 1. Therefore, it is possible to suppress the operation of the parasitic p-n-p bipolar transistor 29 without requiring a complicated manufacturing process, and it is possible to realize an HVIC with high noise immunity <First Modification>

In the first embodiment, the case where the first current suppression layer 21 and the second current suppression layer 22 are provided on the entire bottom surface of the base-body 1 has been described. However, the first current suppression layer 21 and the second current suppression layer 22 may be selectively (locally) provided at the bottom-surface side in the base-body 1 so as to face at least the first well region 2.

Figure 6:
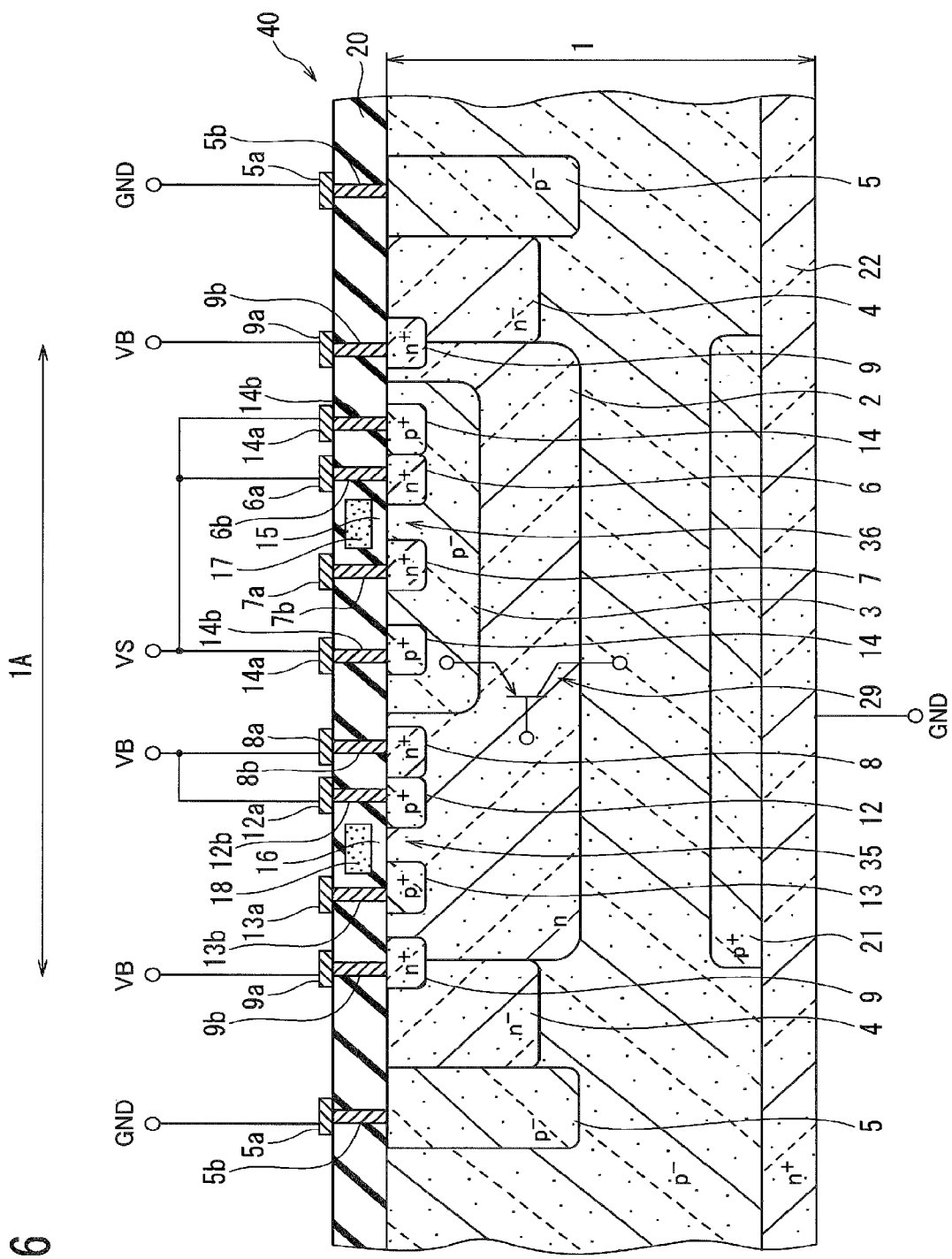
FIG. 6 is a cross-sectional view illustrating a main portion of a semiconductor integrated circuit according to a first modification of the first embodiment of the present invention.

For example, as illustrated in FIG. 6, the first current suppression layer 21 may be locally (selectively) formed in a lower portion at the bottom surface of the base-body 1 so as to face the first well region 2. As an example of a method of forming the first current suppression layer 21 and the second current suppression layer 22 illustrated in FIG. 6, a photoresist film is delineated on a portion other than the first well region 2 on the bottom surface of the base-body 1 by a photolithography technique. By using the delineated photoresist film as a mask, p-type impurity ions such as boron (B) ions are implanted with high energy. After removing the remaining photoresist film, the implanted ions are activated by annealing, and the first current suppression layer 21 is selectively formed, and further, the activated p-type impurity elements are thermally diffused to a desired depth. Subsequently, n-type impurity ions such as arsenic (As) ions or phosphorus (P) ions are implanted into the entire lower portion at the bottom surface of the base-body 1 in a projection range shallower than the first current suppression layer 21 as viewed from the bottom surface of the base-body 1. After that, the implanted ions are activated by annealing, so that the second current suppression layer 22 is formed.

Figure 7:
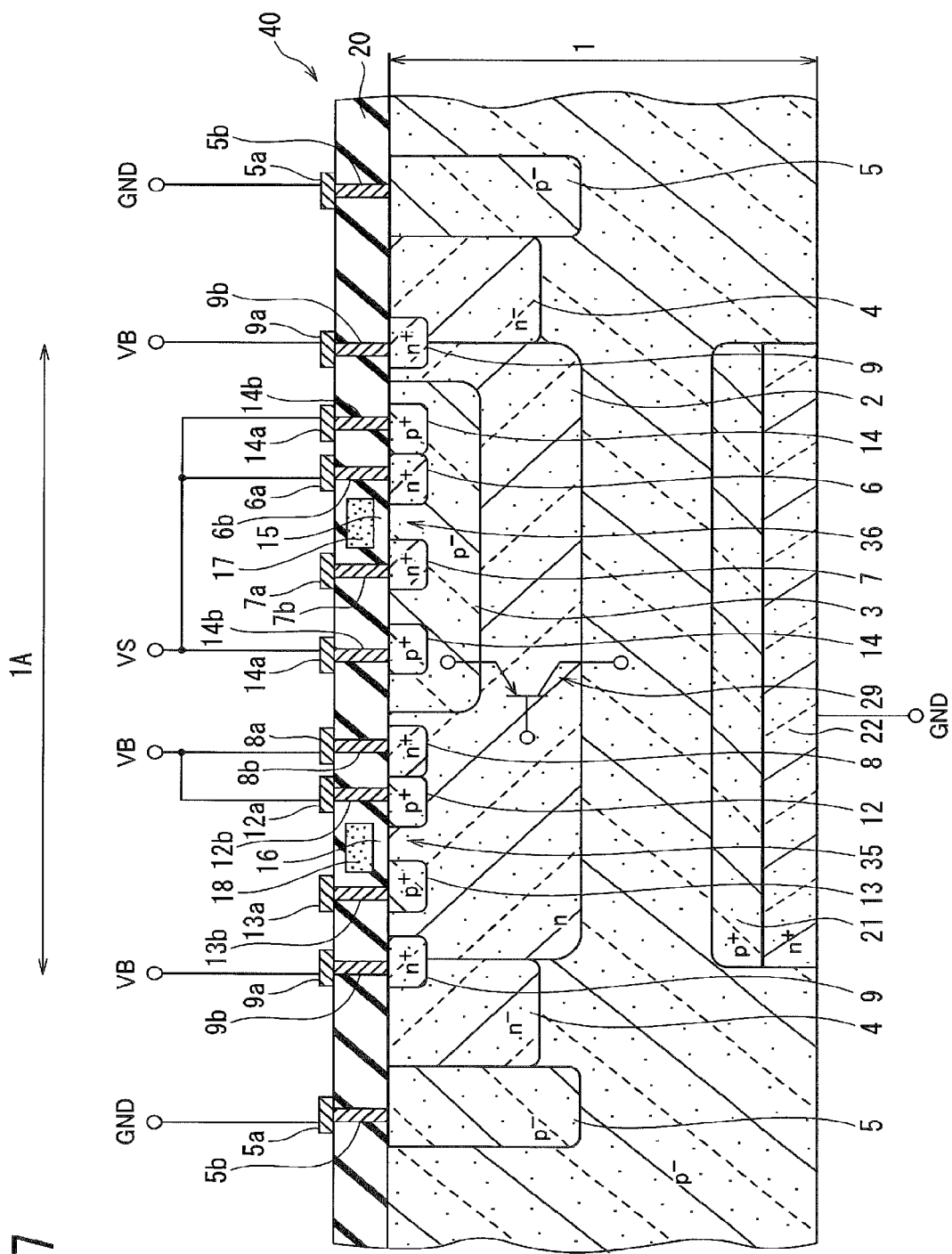
FIG. 7 is a cross-sectional view illustrating a main portion of another HVIC according to the first modification of the first embodiment of the present invention.

In addition, as illustrated in FIG. 7, the first current suppression layer 21 and the second current suppression layer 22 may be locally (selectively) provided on a portion of the bottom surface of the base-body 1 so as to face the first well region 2. As an example of a method of forming the first current suppression layer 21 and the second current suppression layer 22 illustrated in FIG. 7, a photoresist film is delineated on a portion other than the first well region 2 on the bottom surface of the base-body 1 by a photolithography technique. By using the delineated photoresist film as a mask, p-type impurity ions such as B ions are implanted with high energy. Subsequently, by using the delineated photoresist film as a mask, n-type impurity ions such as As ions or P ions are implanted in a projection range shallower than the first current suppression layer 21 as viewed from the bottom surface of the base-body 1. After removing the remaining photoresist film, the implanted ions are activated by annealing, and the first current suppression layer 21 and the second current suppression layer 22 are selectively formed.

Figure 8:
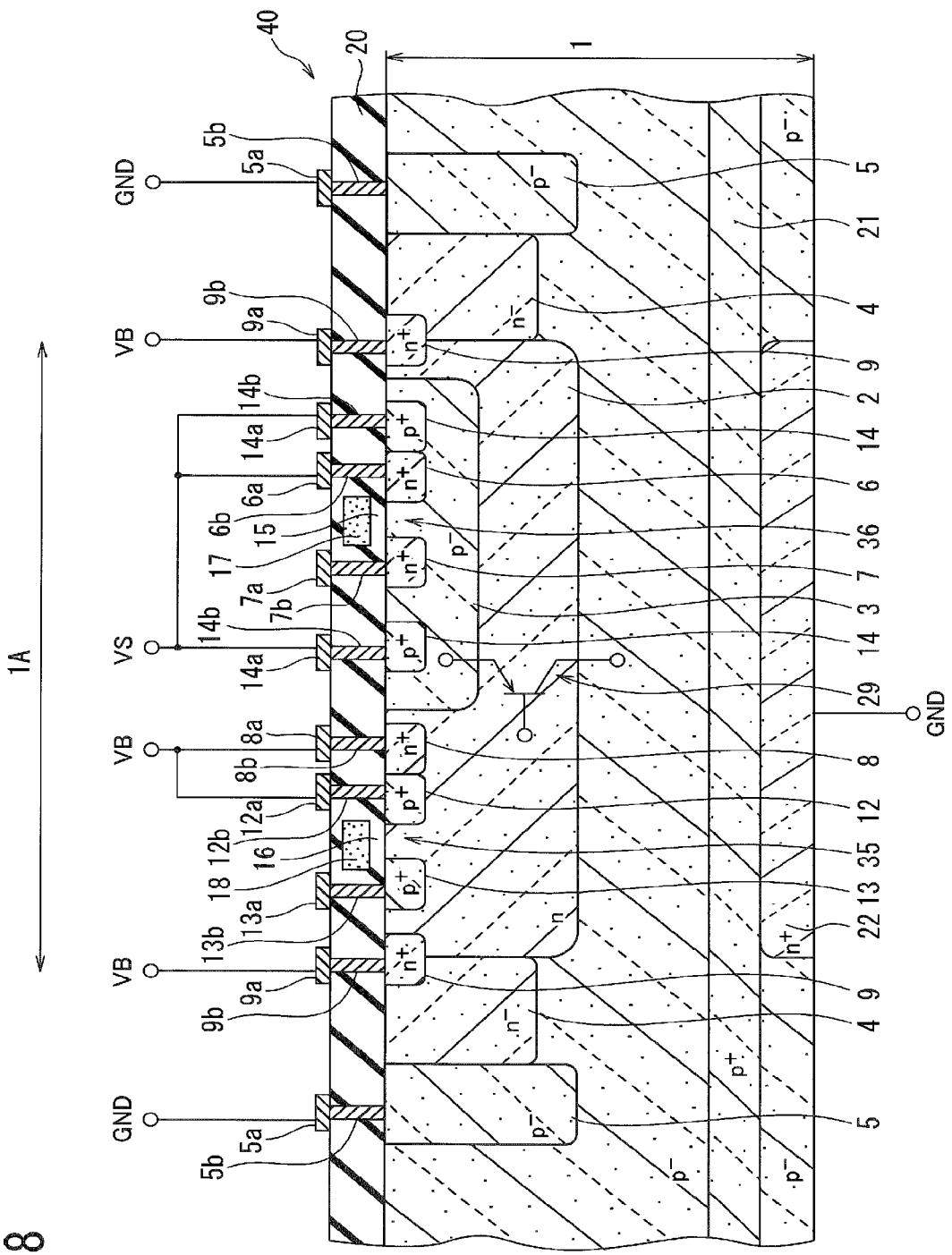
FIG. 8 is a cross-sectional view illustrating a main portion of still another HVIC according to the first modification of the first embodiment of the present invention.

In addition, as illustrated in FIG. 8, the second current suppression layer 22 may be locally (selectively) formed in a lower portion at the bottom surface of the base-body 1 so as to face the first well region 2. As an example of a method of forming the first current suppression layer 21 and the second current suppression layer 22 illustrated in FIG. 8, p-type impurity ions such as B ions are implanted with high energy into the entire lower portion at the bottom surface of the base-body 1. After that, the implanted ions are activated by annealing, so that the first current suppression layer 21 is formed. Then, a photoresist film is delineated on a portion other than the first well region 2 on the bottom surface of the base-body 1 by a photolithography technique. By using the delineated photoresist film as a mask, n-type impurity ions such as As ions or P ions are implanted in a projection range shallower than the first current suppression layer 21 as viewed from the bottom surface of the base-body 1. After removing the remaining photoresist film, the implanted ions are activated by annealing, and the second current suppression layer 22 is selectively formed.

According to the first modification, even in the case where at least one of the first current suppression layer 21 and the second current suppression layer 22 is selectively (locally) provided at the bottom-surface side in the base-body 1 so as to face at least the first well region 2, the operation of the parasitic p-n-p bipolar transistor 29 can be suppressed.

<Second Modification>

Figure 9:
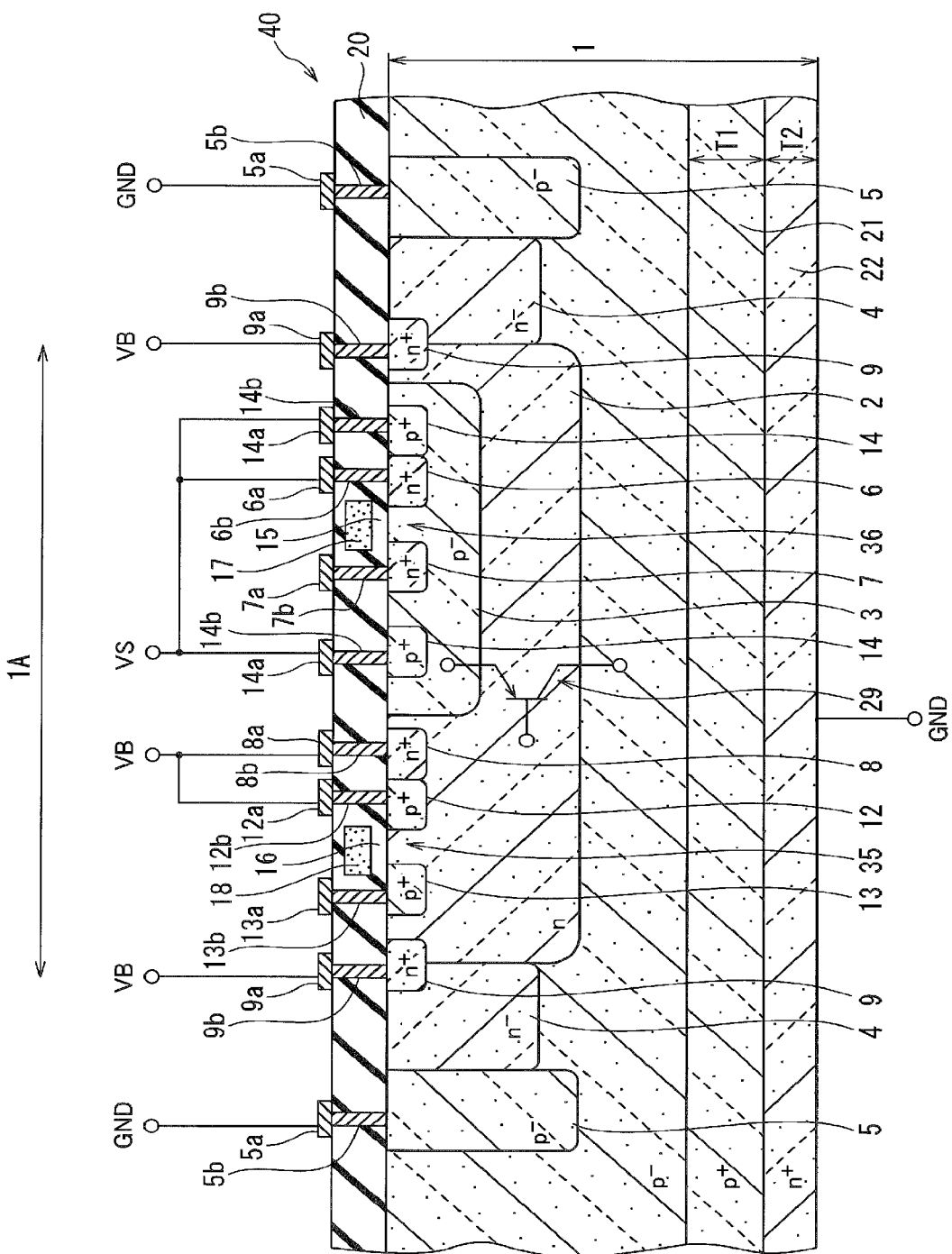
FIG. 9 is a cross-sectional view illustrating a main portion of a semiconductor integrated circuit according to a second modification of the first embodiment of the present invention.

In the first embodiment, the structure where the thickness Ti of the first current suppression layer 21 and the thickness T2 of the second current suppression layer 22 are the same has been exemplified. However, the thickness T1 of the first current suppression layer 21 and the thickness T2 of the second current suppression layer 22 may be different from each other. For example, as illustrated in FIG. 9, the thickness T1 of the first current suppression layer 21 may be larger than the thickness T2 of the second current suppression layer 22. In addition, although not illustrated, the thickness T1 of the first current suppression layer 21 may be smaller than the thickness T2 of the second current suppression layer 22.

The thickness T1 of the first current suppression layer 21 and the thickness T2 of the second current suppression layer 22 can be appropriately adjusted, for example, by adjusting the acceleration voltage and the projection range at the time of ion implantation for forming the first current suppression layer 21 and the second current suppression layer 22.

<Third Modification>

In the first embodiment, the structure where the first current suppression layer 21 and the second current suppression layer 22 are in contact with each other has been exemplified. However, the first current suppression layer 21 and the second current suppression layer 22 may not be necessarily in contact with each other. That is, the first current suppression layer 21 and the second current suppression layer 22 may be separated from each other, and the first current suppression layer 21 may be provided above (on the upper side of) the second current suppression layer 22. For example, as illustrated in FIG. 10, a p$^-$-type semiconductor layer 26 may be inserted between the second current suppression layer 22 and the first current suppression layer 21.

Figure 10:
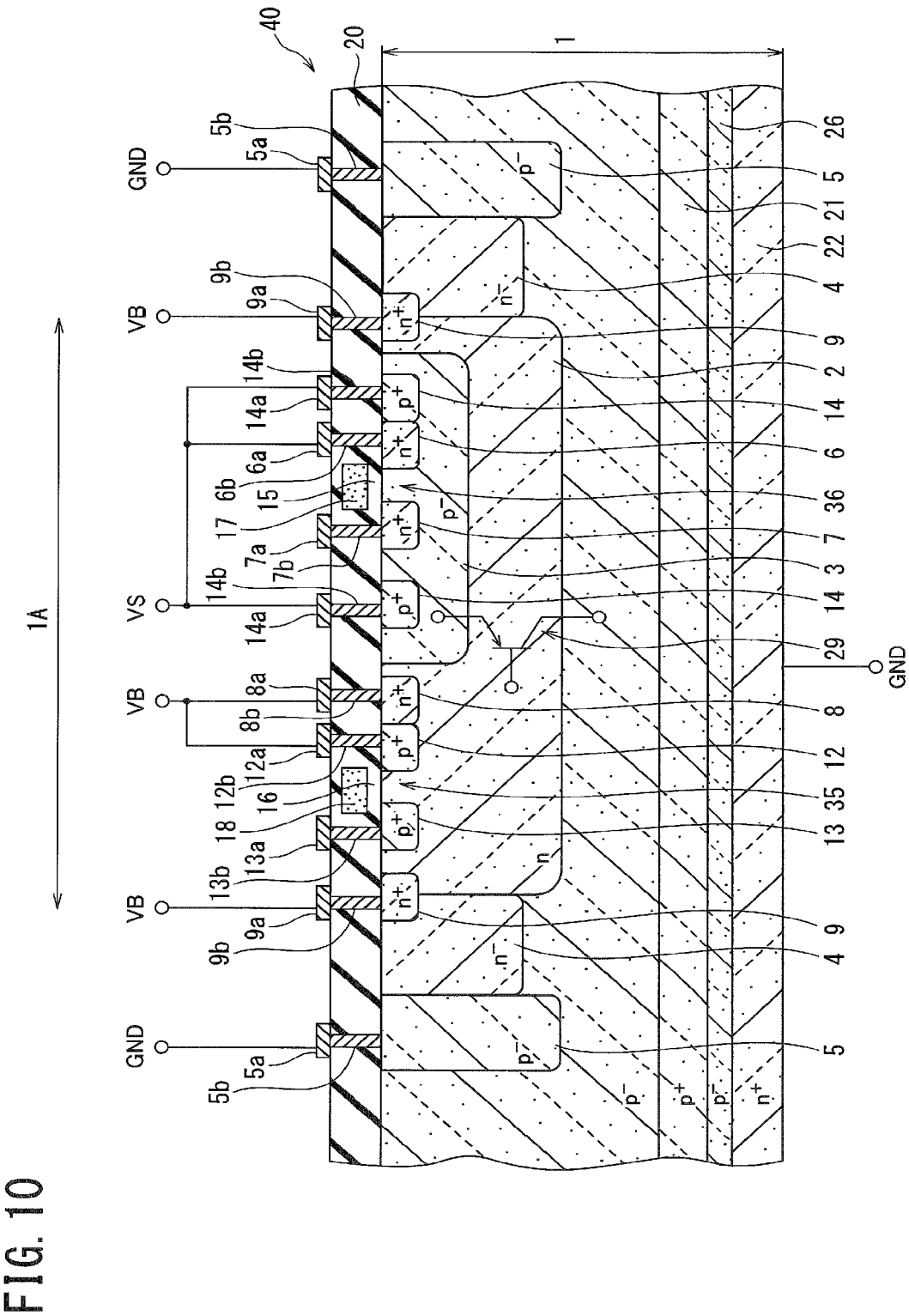
FIG. 10 is a cross-sectional view illustrating a main portion of a semiconductor integrated circuit according to a third modification of the first embodiment of the present invention.

In the structure illustrated in FIG. 10, the first current suppression layer 21 and the second current suppression layer 22 are formed to be separated from each other by adjusting the acceleration voltage and the projection range at the time of ion implantation for forming the first current suppression layer 21 and the second current suppression layer 22. As a result, a portion of the base-body 1 of the second current suppression layer 22 and the first current suppression layer 21 becomes the p$^-$-type semiconductor layer 26. Alternatively, the impurity elements of the second current suppression layer 22 and the impurity elements of the first current suppression layer 21 are allowed to compensate for each other, so that a high resistivity layer such as a p$^-$-type semiconductor layer or an i-type (intrinsic semiconductor) may be configured.

Second Embodiment

Figure 11:
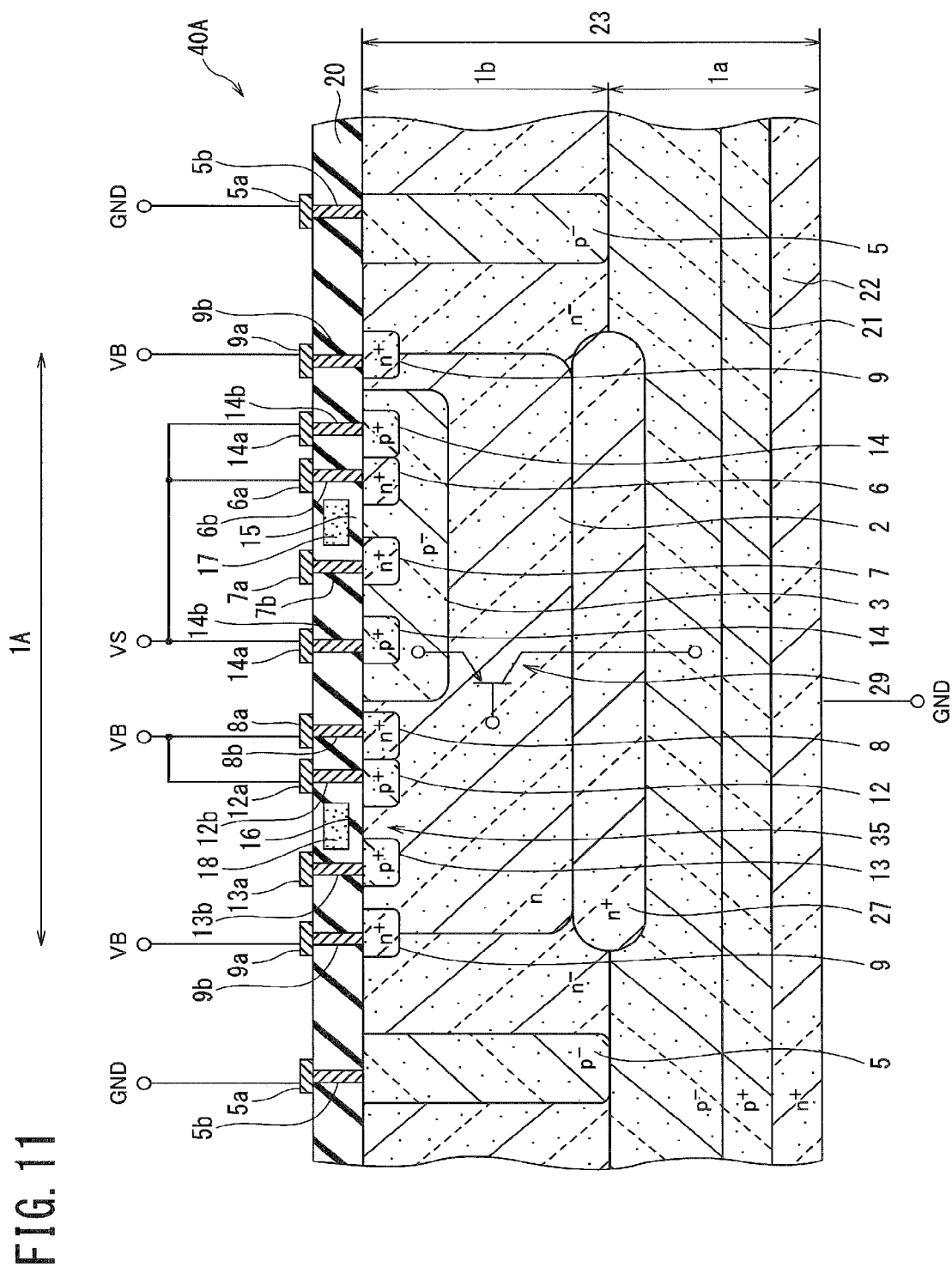
FIG. 11 is a cross-sectional view illustrating a main portion of a semiconductor integrated circuit according to a second embodiment of the present invention.

A semiconductor integrated circuit 40A according to a second embodiment of the present invention has substantially the same configuration as that the semiconductor integrated circuit 40 according to the first embodiment except that the configuration of the semiconductor substrate is different. That is, in the semiconductor integrated circuit 40 according to the first embodiment, as illustrated in FIG. 3, the p$^-$-type base-body 1 implemented by a semiconductor substrate is explained. In contrast, in the semiconductor integrated circuit 40A according to the second embodiment, as illustrated in FIG. 11, a base-body 23 where a first conductivity type (n$^-$-type) semiconductor layer 1b is stacked on a second conductivity type (p$^-$-type) semiconductor substrate 1a by, for example, epitaxial growth method, is exemplified. In the high-side circuit arrangement-area 1A of the base-body 23, an n$^+$-type buried region 27 having an impurity concentration higher than those of the semiconductor substrate 1a and the semiconductor layer 1b is buried between the semiconductor substrate 1a and the semiconductor layer 1b.

The first well region 2 and the isolation region 5 are provided in the semiconductor layer 1b. The first well region 2 is provided to be in contact with the buried region 27 in the semiconductor layer 1b on the buried region 27. The isolation region 5 is formed at a depth reaching the semiconductor substrate 1a. The second current suppression layer 22 is provided in a lower portion of the semiconductor substrate 1a directly under the first well region 2 so as to be separated from the first well region 2 and the buried region 27. In the first embodiment, as illustrated in FIG. 3, the configuration where the breakdown-voltage improving-region 4 is inserted between the first well region 2 and the isolation region 5 is illustrated. However, in the second embodiment, as illustrated in FIG. 11, the configuration where a portion of the semiconductor layer 1b is inserted between the first well region 2 and the isolation region 5 instead of the breakdown-voltage improving-region 4 of FIG. 3 is exemplified. Therefore, the n$^+$-type third contact region 9 is provided in the upper portion of each of the first well region 2 and the semiconductor layer 1b over the first well region 2 and the semiconductor layer 1b. Other configurations are the same as those of the first embodiment.

The semiconductor integrated circuit 40A according to the second embodiment includes a highly-doped buried region 27 buried between the semiconductor substrate 1a and the semiconductor layer 1b so as to be in contact with the first well region 2 in the high-side circuit arrangement-area 1A. Therefore, the doping concentration of the base in the parasitic p-n-p bipolar transistor 29 becomes high, and thus, the current amplification factor $H_{FE}$ of the parasitic p-n-p bipolar transistor 29 can be lowered, so that the operation of the parasitic p-n-p bipolar transistor 29 can be suppressed.

Furthermore, similarly to the first embodiment, the semiconductor integrated circuit 40A according to the second embodiment includes, in the high-side circuit arrangement-area 1A, the first current suppression layer 21 and the second current suppression layer 22 that are provided in the lower portion of the semiconductor substrate 1a directly under the first well region 2 so as to be separated from the first well region 2 and the buried region 27. Therefore, similarly to the first embodiment, the operation of the parasitic p-n-p bipolar transistor 29 can be suppressed. As a result, the semiconductor integrated circuit 40A according to the second embodiment can further suppress the operation of the parasitic p-n-p bipolar transistor 29 as compared with the first embodiment.

Third Embodiment

Figure 12:
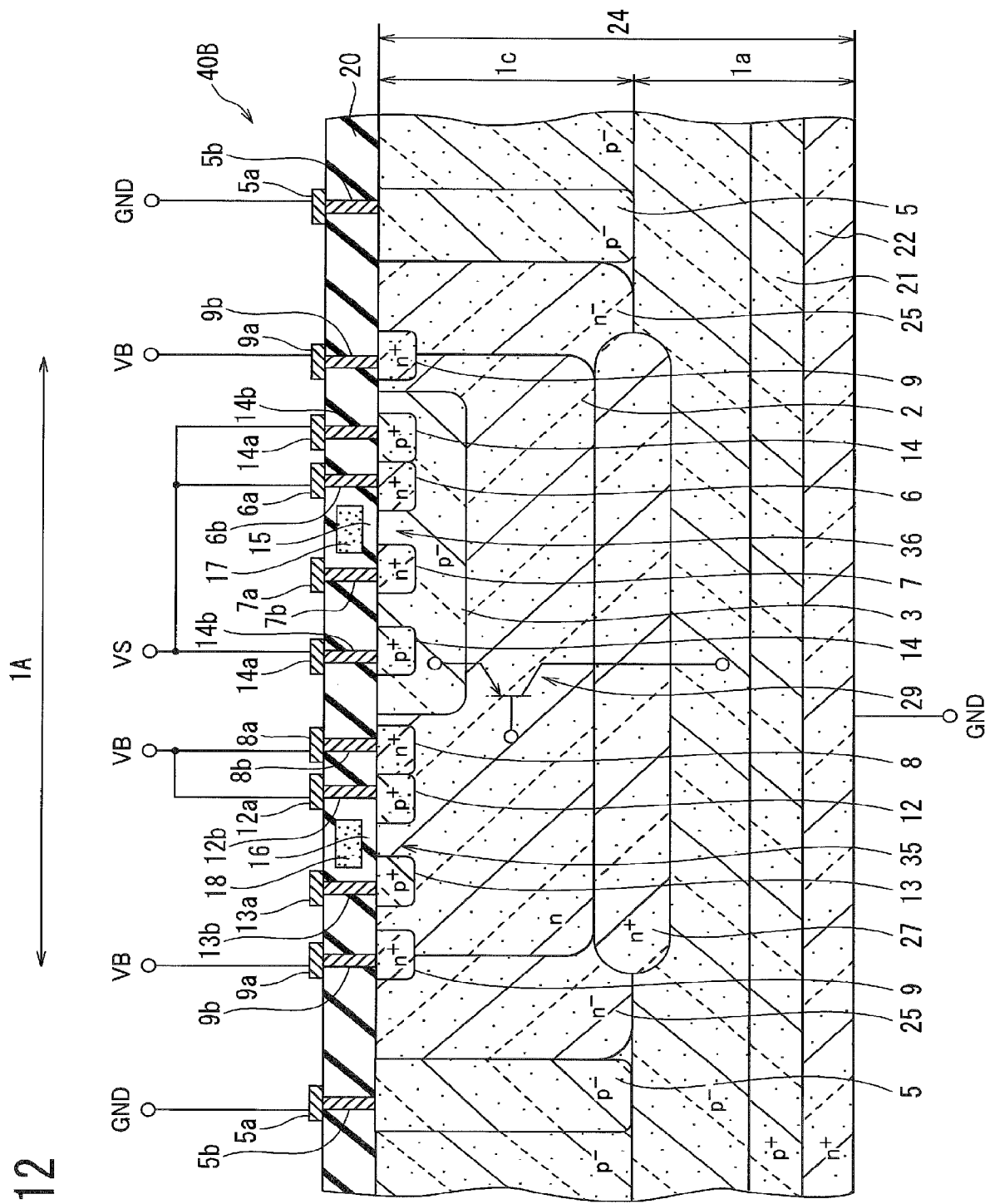
FIG. 12 is a cross-sectional view illustrating a main portion of a semiconductor integrated circuit according to a third embodiment of the present invention.

A semiconductor integrated circuit 40B according to the third embodiment of the present invention has substantially the same configuration as that of the semiconductor integrated circuit 40A according to the second embodiment except that the configuration of the semiconductor base body is different. That is, in the semiconductor integrated circuit 40A according to the second embodiment, as illustrated in FIG. 11, the base-body 23 provided with the $n^-$-type semiconductor layer 1b on the $p^-$-type semiconductor substrate 1a is illustrated. In contrast, in the semiconductor integrated circuit 40B according to the third embodiment, as illustrated in FIG. 12, a base-body 24 provided with a second conductivity type ($p^-$-type) semiconductor layer 1c on a second conductivity type ($p^-$-type) semiconductor substrate 1a is exemplified. In the high-side circuit arrangement-area 1A of the base-body 24, an $n^+$-type buried region 27 having an impurity concentration higher than those of the semiconductor substrate 1a and the semiconductor layer 1c is buried between the semiconductor substrate 1a and the semiconductor layer 1c.

The isolation region 5 is provided in the semiconductor layer 1c at a depth reaching the semiconductor substrate 1a. In the semiconductor layer 1c, a first conductivity type ($n^-$-type) third well region 25 is provided. The first well region 2 is provided inside the third well region 25. The first well region 2 is provided on the buried region 27 so as to be in contact with the buried region 27 inside the third well region 25. In the second embodiment, as illustrated in FIG. 11, the configuration where a part of the semiconductor layer 1b is inserted between the first well region 2 and the isolation region 5 is exemplified. However, in the third embodiment, as illustrated in FIG. 12, the configuration where the third well region 25 is inserted between the first well region 2 and the isolation region 5 instead of the semiconductor layer 1b illustrated in FIG. 11 is exemplified. Therefore, the $n^+$-type third contact region 9 is provided in the upper portion of each of the first well region 2 and the third well region 25 over the first well region 2 and the third well region 25. Other configurations are the same as those of the second embodiment.

The semiconductor integrated circuit 40B according to the third embodiment includes a highly-doped buried region 27 buried between the semiconductor substrate 1a and the semiconductor layer 1c so as to be in contact with the first well region 2 in the high-side circuit arrangement-area 1A. Therefore, the doping concentration of the base in the parasitic p-n-p bipolar transistor 29 becomes high, and thus, the current amplification factor $H_{FE}$ of the parasitic p-n-p bipolar transistor 29 can be lowered, so that the operation of the parasitic p-n-p bipolar transistor 29 can be suppressed.

Furthermore, similarly to the first embodiment, the semiconductor integrated circuit 40B according to the third embodiment includes, in the high-side circuit arrangement-area 1A, the first current suppression layer 21 and the second current suppression layer 22 that are provided in the lower portion of the semiconductor substrate 1a directly under the first well region 2 so as to be separated from the first well region 2 and the buried region 27. Therefore, similarly to the first embodiment, the operation of the parasitic p-n-p bipolar transistor 29 can be suppressed. As a result, similarly to the second embodiment, the semiconductor integrated circuit 40B according to the third embodiment can further suppress the operation of the parasitic p-n-p bipolar transistor 29 as compared with the first embodiment.

Fourth Embodiment

Figure 13:
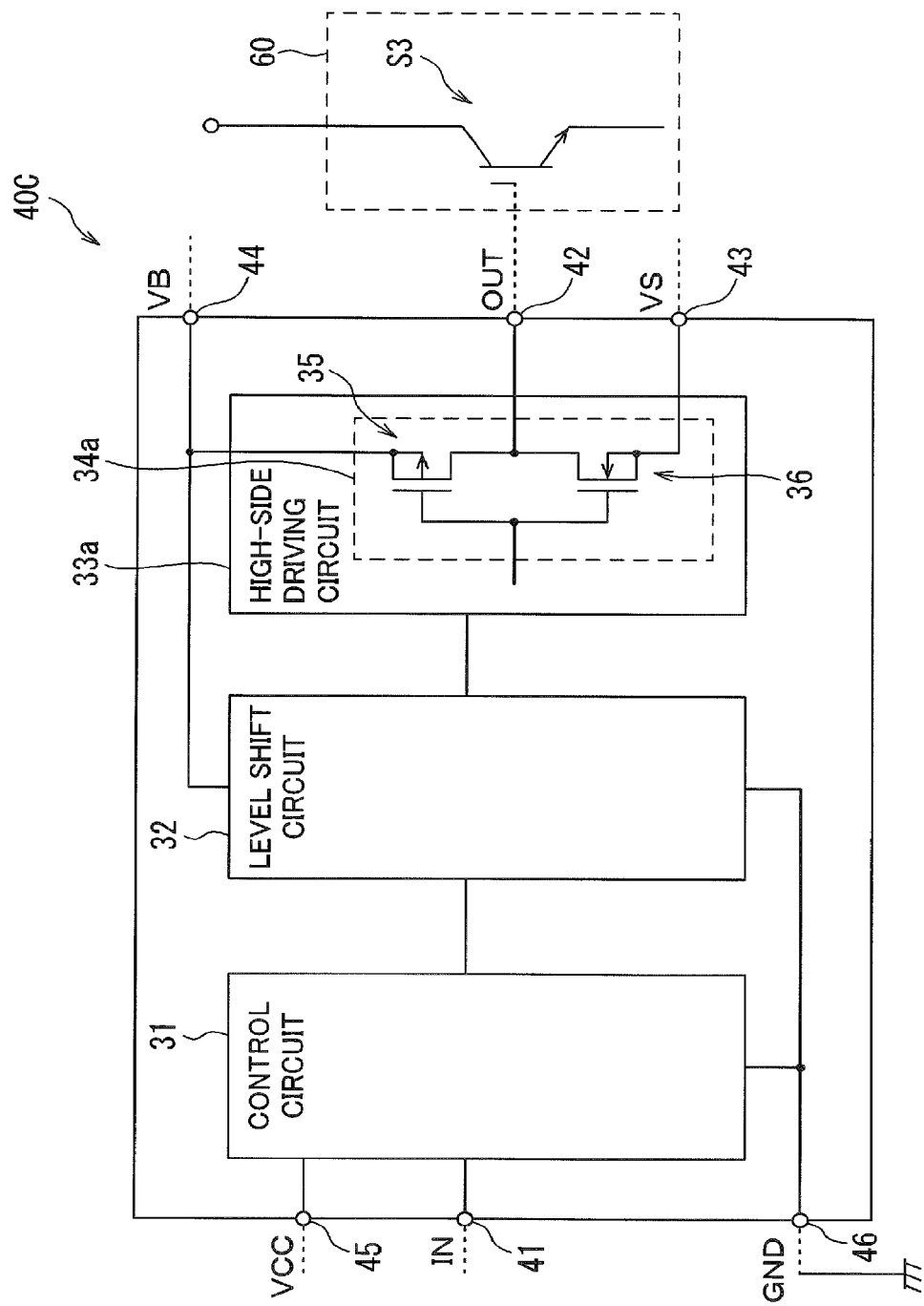
FIG. 13 is a circuit diagram schematically illustrating the structure of a semiconductor integrated circuit according to a fourth embodiment of the present invention.
Figure 14:
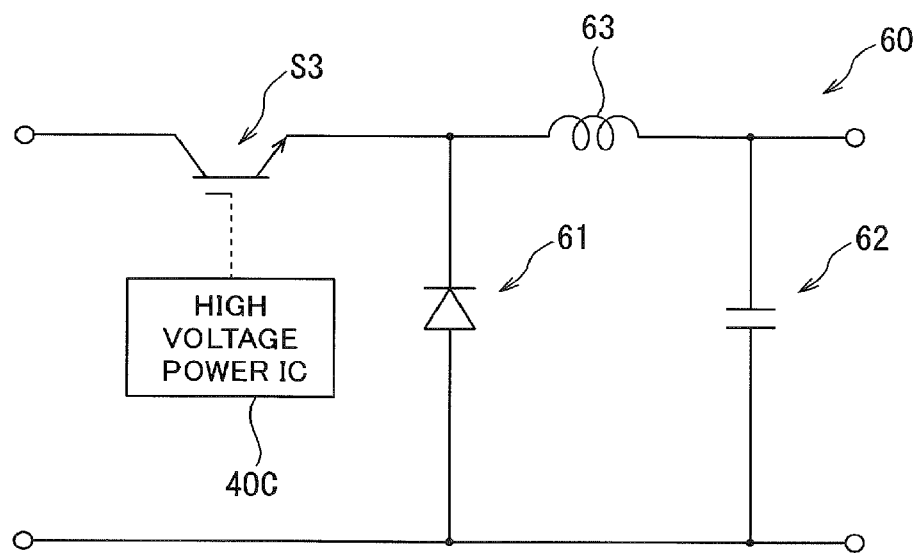
FIG. 14 is a circuit diagram schematically illustrating the structure of a step-down converter using the HVIC according to the fourth embodiment of the present invention.

As illustrated in FIG. 13, a semiconductor integrated circuit 40C according to a fourth embodiment of the present invention is the HVIC including, for example, a control circuit 31, a level shift circuit 32, and a driving circuit 33a. As illustrated in FIG. 13, the semiconductor integrated circuit 40C drives, for example, a switching element S3 of a step-down converter 60. As illustrated in FIG. 14, the step-down converter 60 includes, for example, a diode 61, a capacitor 62, a coil 63, and the power switching elements S3. The power switching elements S3 is an active element such as an IGBT.

The driving circuit 33a includes a gate driving circuit 34a. The gate driving circuit 34a has the same structure as the gate driving circuit 34 according to the first embodiment. Specifically, a source of a pMOS transistor 35 is connected to a VB-terminal 44 and a drain of the pMOS transistor 35 is connected to a drain of an nMOS transistor 36. A source of the nMOS transistor 36 is connected to a VS-terminal 43. A gate of the power switching elements S3 implementing the step-down converter 60 is connected to a connection point between the pMOS transistor 35 and the nMOS transistor 36.

The gate driving circuit 34a operates with the VS-potential of a second potential being applied to the VS-terminal 43, as a reference potential and a VB-potential of a first potential being applied to the VB-terminal 44, as a power-supply potential. The gate driving circuit 34a transmits a driving signal from an output terminal 42 in accordance with a signal received from the level shift circuit 32 to drive the power switching elements S3 of the step-down converter 60.

By the semiconductor integrated circuit 40C according to the fourth embodiment, which drives the power switching elements S3 of the step-down converter 60, similarly to the first embodiment, it is possible to suppress the operation of a parasitic p-n-p bipolar transistor 29 including a $p^-$-type second well region 3, an $n^-$-type first well region 2, and a $p^-$-type semiconductor substrate implementing the base-body 1, similar to the configuration illustrated in FIG. 3.

In the fourth embodiment, the semiconductor integrated circuit which drives the power switching elements S3 of the step-down converter 60 has been explained. However, the invention is not limited the subject matter disclosed by the fourth embodiment. For example, the invention can be applied to semiconductor integrated circuits for driving power switching elements of a boost converter, a flyback converter, and a forward converter.

Other Embodiments

The invention has been explained above on the basis of the above-described embodiments. However, the invention is not limited to the above-described embodiments and various modifications and changes of the invention can be made without departing from the scope and spirit of the invention. As described above, it is possible to improve the reliability of the HVIC according to the invention and the HVIC according to the invention can be useful for a HVIC including a driving circuit which drives a power switching element.

What is claimed is:

1. A method of manufacturing a semiconductor integrated circuit including a first well region of a first conductivity type, a second well region of a second conductivity type provided in an upper portion of the first well region, a first current suppression layer of the second conductivity type being provided in a lower portion of a semiconductor substrate of the second conductivity type, the first current suppression layer is disposed directly under the first well region being separated from the first well region and having an impurity concentration higher than that of the semiconductor substrate, and a second current suppression layer of the first conductivity type provided under the first current suppression layer, the second current suppression layer is exposed from a bottom surface of the semiconductor substrate, the method comprising:
a first ion implantation process implanting impurity ions of the second conductivity type into the bottom surface of the semiconductor substrate by adjusting an acceleration voltage and a projection range for forming the first current suppression layer; and
a second ion implantation process implanting impurity ions of the first conductivity type into the bottom surface of the semiconductor substrate by adjusting an acceleration voltage and a projection range for forming the second current suppression layer.

2. A method of manufacturing a semiconductor integrated circuit including a first well region of a first conductivity type, a second well region of a second conductivity type provided in an upper portion of the first well region, a first current suppression layer of the second conductivity type being provided in a lower portion of a semiconductor substrate of the second conductivity type, the first current suppression layer is disposed directly under the first well region being separated from the first well region and having an impurity concentration higher than that of the semiconductor substrate, and a second current suppression layer of the first conductivity type provided under the first current suppression layer, the second current suppression layer is exposed from a bottom surface of the semiconductor substrate, the method comprising:
a first ion implantation process implanting impurity ions of the second conductivity type for forming the first current suppression layer into the bottom surface of the semiconductor substrate;
forming the first current suppression layer by activating the implanted impurity ions in the first ion implantation process;
a second ion implantation process implanting impurity ions of the first conductivity type for forming the second current suppression layer into the bottom surface of the semiconductor substrate; and
forming the second current suppression layer by activating the implanted impurity ions in the second ion implantation process.

3. The method of claim 1, wherein the first and second current suppression layers are formed in contact with each other.

4. The method of claim 1, wherein the first and second current suppression layers are formed and separated from each other.

5. The method of claim 1, wherein the first and second current suppression layers are formed in parallel with the bottom surface of the semiconductor substrate, being provided over the entire bottom surface.

6. The method of claim 1, wherein at least one of the first and second current suppression layers is locally formed at the semiconductor substrate directly under the first well region.

7. The method of claim 1, further comprising:
forming an isolation region of the second conductivity type that is provided in the upper portion of the semiconductor substrate and that is separated from the first well region and applied with a reference potential.

8. The method of claim 1, further comprising:
forming a semiconductor layer provided on an upper surface of the semiconductor substrate with a buried region of the first conductivity type interposed between the semiconductor layer and the semiconductor substrate,
wherein the first well region is formed in an upper portion of the semiconductor layer on the buried region so that the first well region is in contact with the buried region, and
wherein the first and second current suppression layers are formed to be separated from the buried region.

9. The method of claim 1, wherein the first current suppression layer has an impurity concentration of $1 \times 10^{14}$ to $1 \times 10^{21}/cm^3$.

10. The method of claim 1, wherein the second current suppression layer has an impurity concentration of $1 \times 10^{14}$ to $1 \times 10^{21}/cm^3$.

11. The method of claim 2, wherein the first and second current suppression layers are formed in contact with each other.

12. The method of claim 2, wherein the first and second current suppression layers are formed and separated from each other.

13. The method of claim 2, wherein the first and second current suppression layers are formed in parallel with the bottom surface of the semiconductor substrate, and provided over the entire bottom surface.

14. The method of claim 2, wherein at least one of the first and second current suppression layers is locally formed at the semiconductor substrate directly under the first well region.

15. The method of claim 2, further comprising:
forming an isolation region of the second conductivity type that is provided in the upper portion of the semiconductor substrate and that is separated from the first well region and applied with a reference potential.

16. The method of claim 2, further comprising:
forming a semiconductor layer provided on an upper surface of the semiconductor substrate with a buried region of the first conductivity type interposed between the semiconductor layer and the semiconductor substrate, wherein the first well region is formed in an upper portion of the semiconductor layer on the buried region so that the first well region is in contact with the buried region, and wherein the first and second current suppression layers are formed and separated from the buried region.

17. The method of claim 2, wherein the first current suppression layer has an impurity concentration of $1\times10^{14}$ to $1\times10^{21}/cm^3$.

18. The method of claim 2, wherein the second current suppression layer has an impurity concentration of $1\times10^{14}$ to $1\times10^{21}/cm^3$.

* * * * *